(12) United States Patent
Wamura et al.

(10) Patent No.: US 9,080,238 B2
(45) Date of Patent: Jul. 14, 2015

(54) RAW MATERIAL SUPPLYING DEVICE AND FILM FORMING APPARATUS

(75) Inventors: Yu Wamura, Nirasaki (JP); Haruhiko Furuya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 857 days.

(21) Appl. No.: 13/328,252

(22) Filed: Dec. 16, 2011

(65) Prior Publication Data
US 2012/0160172 A1 Jun. 28, 2012

(30) Foreign Application Priority Data
Dec. 28, 2010 (JP) .................................. 2010-293207

(51) Int. Cl.
| | |
|---|---|
| B08B 9/02 | (2006.01) |
| C23C 16/455 | (2006.01) |
| B08B 3/04 | (2006.01) |
| C23C 16/44 | (2006.01) |

(52) U.S. Cl.
CPC ............. *C23C 16/45561* (2013.01); *B08B 3/04* (2013.01); *B08B 9/02* (2013.01); *C23C 16/4402* (2013.01); *Y10T 137/4238* (2015.04); *Y10T 137/4259* (2015.04)

(58) Field of Classification Search
CPC ...... B08B 3/04; B08B 9/02; C23C 16/45561; C23C 16/4402; Y10T 137/4259; Y10T 137/4238
USPC .................................. 137/237, 240; 118/726
See application file for complete search history.

(56) References Cited

U.S. PATENT DOCUMENTS

| | | | | |
|---|---|---|---|---|
| 6,581,625 B1 * | 6/2003 | Arai et al. | ..................... | 137/240 |
| 7,343,926 B2 * | 3/2008 | Okabe et al. | .................. | 137/240 |
| 8,544,500 B2 * | 10/2013 | Itafuji et al. | .................. | 137/614 |

FOREIGN PATENT DOCUMENTS

| | | |
|---|---|---|
| JP | 10-227368 A | 8/1998 |
| JP | 2005-129782 A | 5/2005 |

* cited by examiner

*Primary Examiner* — Kevin Lee
(74) *Attorney, Agent, or Firm* — Nath, Goldberg & Meyer; Jerald L. Meyer

(57) ABSTRACT

A raw material supplying device includes a raw material supplying pipe including a vertically extending rising pipe. The device further includes a first raw material discharging pipe which is provided to branch from the lower end of the rising pipe. The device further includes a cleaning fluid supplying pipe configured to supply one of purge gas and cleaning solution in order to extrude and discharge liquid raw material in the raw material supplying pipe to the first raw material discharging pipe. The device further includes a first raw material supplying valve and a first raw material discharging valve which are respectively provided in the side of the repository and the first raw material discharging pipe other than a connection portion of the raw material supplying pipe with the first raw material discharging pipe. The device further includes a cleaning fluid supplying valve provided in the cleaning fluid supplying pipe.

9 Claims, 41 Drawing Sheets

Cleaning fluid supplying valve 75

Second raw material supplying valve 74

Gas supplying valve 77

Cleaning solution suppling valve 78

A1

A2

A3

RAW MATERIAL SUPPLYING DEVICE AND FILM FORMING APPARATUS

CROSS-REFERENCE TO RELATED APPLICATION

This application claims the benefit of Japanese Patent Application No. 2010-293207, filed on Dec. 28, 2010, in the Japan Patent Office, the disclosure of which is incorporated herein in its entirety by reference.

TECHNICAL FIELD

The present disclosure relates to a raw material supplying device for supplying liquid material and a film forming apparatus including the raw material supplying device.

BACKGROUND

Gas produced by vaporizing liquid raw material such as metal organic compounds by means of a vaporizer has been often used as process gas used for film forming processes in semiconductor manufacturing apparatuses. An example of film forming process may include a process of using liquid raw material, for example, tetrakis(ethylmethylamino)zirconium (TEMAZ), tetrakis(ethylmethylamino)hafnium (TEMAH), strontium bis(tetramethyl-heptanedionate) (Sr(THD)$_2$) or the like, to form a high-permittivity film on a semiconductor wafer (hereinafter abbreviated as "wafer"). In this system, a vacuum pump to vacuumize the interior of a reaction container (reaction tube) in which the film forming process is performed and a raw material tank which is a repository of liquid material are, for example, installed below a vaporizer or the reaction tube (at a height position of operation by an operator or in the underground) in order to make a foot print of the system as small as possible. A raw material supplying device including raw material supplying pipes, valves and so on supplies liquid material from the raw material tank into the vaporizer upward.

In some case, the vaporizer and/or the raw material tank may be removed for maintenance of the vaporizer and/or exchange of the raw material tank with a new one. In this case, if the liquid material contacts the air, toxic gas such as diethylamine $(C_2H_5)_2NH$, dimethylamine $(CH_3)_2NH$ or the like may be generated or there is a possibility that the raw material supplying pipe is blocked by reaction products generated by reaction of the liquid material with water contained in the air. Accordingly, when the vaporizer or the raw material tank is removed from the system, the liquid material is removed in advance from the raw material supplying pipe. Specifically, for example, the liquid material is extruded upward against a force of gravity by purging inert gas such as nitrogen $(N_2)$ or the like from below (the side of the raw material tank) into the raw material supplying pipe and is discharged from a vent pipe provided in the front of the reaction tube (in the side of the raw material supplying pipe) through the raw material supplying pipe in the side of the vaporizer. Thereafter, for example, the interiors of the raw material supplying pipe and the vaporizer are cleaned by flowing the cleaning solution such as octane or the like from below through the raw material supplying pipe, the cleaning solution is discharged from the vent pipe by the inert gas, and then the interior of the raw material supplying pipe is vacuumized and dried by the vaporizer.

However, since the liquid material has a specific gravity higher (i.e., is heavier) than that of water or the like, when the liquid material is to be extruded downward by the gas, the liquid material stays in the raw material supplying pipe and is in a so-called bubbling state where bubbles are to rise in the liquid material. This makes it difficult to remove the liquid material from the raw material supplying pipe even with increase in a gas pressure. In addition, since such liquid material has a vapor pressure lower than that of water or the like, for example, the liquid material is hard to be volatilized even when the interior of the raw material supplying pipe is vacuumized before the cleaning solution is supplied. In addition, since the interior of the raw material supplying pipe is not opened, it is not possible to directly confirm whether or not the liquid material is completely removed from the raw material supplying pipe.

If any liquid material is left in the raw material supplying pipe when the cleaning solution is supplied into the raw material supplying pipe, there may be a case where some water contained in the cleaning solution reacts with the liquid material, which may result in attachment (adhesion) of reaction products on a surface of a diaphragm (valve body) of a valve disposed on the raw material supplying pipe, for example. This may require frequent exchange of the diaphragm or the valve, which results in increase in running costs of the system.

Accordingly, when the vaporizer and/or the raw material tank are removed from the system, the liquid material has to be removed from the raw material supplying pipe by continuously flowing gas through the raw material supplying gas for, for example, a few days in order to secure a period of time for liquid removal (a period of time for supply of gas) slightly longer than a period of time for discharging of the liquid material even if the amount of liquid material left in the raw material supplying pipe is only several tens cc. Accordingly, operation hours (film forming time) of the system are shortened as much as time required for the removal of liquid from the raw material supplying pipe, and cost of nitrogen gas increases. In addition, even when such gas is supplied into the raw material supplying pipe for a long time, some liquid material may still be left in the raw material supplying pipe. In addition, likewise, even the cleaning solution is hard to be discharged from the raw material supplying pipe since it is extruded by the gas directing from below to above. In addition, when the liquid material is to be returned to the raw material tank by the gas supplied into the raw material supplying pipe from above (the side of the vaporizer), there is a possibility of contamination of the liquid material in the raw material tank through the inner wall of the raw material supplying pipe.

There is no document addressing the above-described problems although some techniques regarding a raw material supplying pipe and a valve are arranged to flow liquid from above to below have been known.

SUMMARY

According to one embodiment of the present disclosure, there is provided a raw material supplying device for vaporizing liquid raw material contained in a repository using a vaporizer, and supplying vaporized gas into a reaction container for semiconductor manufacture, including a raw material supplying pipe including a vertically extending rising pipe having an upper end and a lower end to which the vaporizer and the repository are connected respectively; a first raw material discharging pipe which is provided to branch from the lower end of the rising pipe; a cleaning fluid supplying pipe which is connected to the upper end of the rising pipe and supplies one of purge gas and cleaning solution in order to extrude and discharge liquid raw material in the raw material supplying pipe to the first raw material discharging pipe; a first raw material supplying valve and a first raw material discharging valve which are respectively provided in the side of the repository and the first raw material discharging pipe other than a connection portion of the raw material supplying pipe with the first raw material discharging pipe; and a cleaning fluid supplying valve which is provided in the cleaning fluid supplying pipe, wherein, when the liquid raw material is supplied into the vaporizer, the first raw material supplying valve is opened and the first raw material discharging valve and the cleaning fluid supplying valve are closed, and when the liquid raw material is discharged, the first raw material supplying valve is closed and the first raw material discharging valve and the cleaning fluid supplying valve are opened.

According to another embodiment of the present disclosure, there is provided a film forming apparatus including: the above-described raw material supplying device; a vaporizer which vaporizes liquid material supplied from the raw material supplying device; and a reaction container which supplies process gas obtained by vaporizing the liquid material in the vaporizer to substrates accommodated in the reaction container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
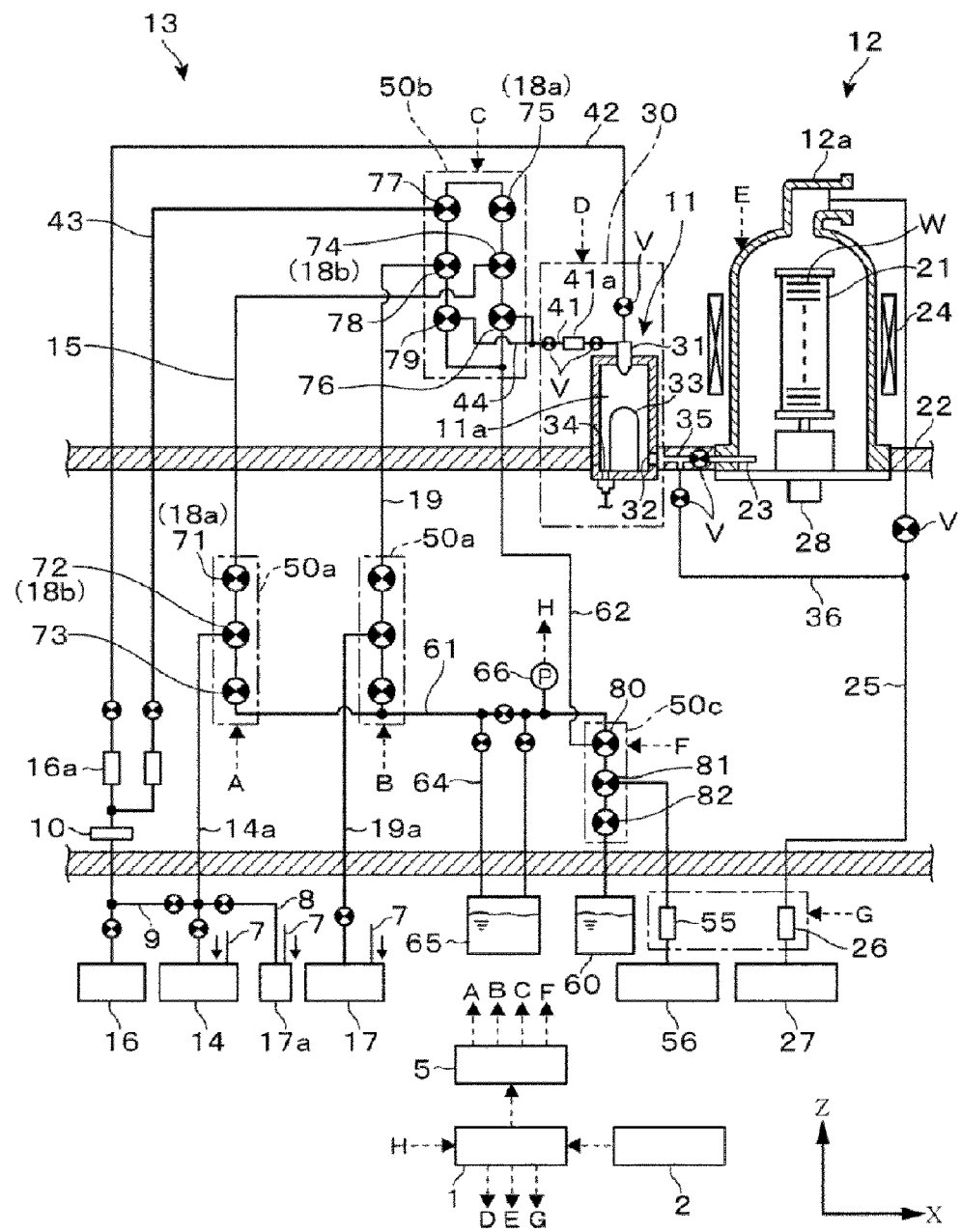
FIG. 1 is a longitudinal sectional view showing an example of a vertical heat processing apparatus including a raw material supplying device according to an embodiment of the present disclosure.

An embodiment of a vertical heat processing apparatus to which a raw material supplying device of the present disclosure is applied will now be described in detail with reference to FIGS. 1 to 10. This vertical heat processing apparatus is configured as a film forming apparatus including a vaporizer 11 which vaporizes liquid material including film forming species, for example, tetrakis(ethylmethylamino)zirconium (TEMAZ), and a reaction tube (reaction container) 12 which performs a film forming process by supplying process gas obtained by the vaporization of liquid material in the vaporizer 11 onto a wafer W. A raw material supplying device 13 supplies the liquid material from a raw material repository 14 disposed below the vaporizer 11 and the reaction tube 12 to the vaporizer 11 via a raw material supplying pipe (a rising duct) 15. As will be described later, when a liquid in the raw material supplying pipe 15 is removed (removal of liquid material) for maintenance of the vaporizer 11 and exchange of the raw material repository 14, for example, the raw material supplying device 13 is configured to easily and quickly discharge the liquid material out of the raw material supplying pipe 15.

First, the reaction tube 12 and the vaporizer 11 will be described in brief. As shown in FIG. 1, the reaction tube 12 is made of cylindrical quartz, its bottom is opened as a furnace hole, and an exhaust port 12a for vacuumizing the internal atmosphere of the reaction tube 12 is formed in the central portion of the top of the reaction tube 12. In addition, the reaction tube 12 is supported to a base plate 22 such that the bottom of the reaction tube 12 is located at a height position apart by, for example, 2 mm or so from a level of floor, so that a wafer boat 21 loading wafers W in the form of a shelf can be airtightly inserted from below. One end portion of a gas injector 23 for introducing process gas into the reaction tube 12 is airtightly inserted in a flange of the bottom of the reaction tube 12. A heater 24 for heating the wafer W in the reaction tube 12 is circumferentially provided in the outside of the reaction tube 12. An exhaust pipe 25 extending from the exhaust port 12a is connected to a vacuum pump 27 which is a vacuum exhauster provided below the reaction tube 12, for example, in a portion (underground) lower than the floor level, via a pressure regulator such as a butterfly valve 26 or the like. In FIG. 1, reference numeral 28 denotes a motor for rotating the wafer boat 21 around a vertical axis. The reaction tube 12 and the vaporizer 11 are drawn briefly in FIG. 1.

The vaporizer 11 of a cylindrical shape is provided to be adjacent to the reaction tube 12 in the lateral side of the reaction tube 12 and a nozzle (two-fluid nozzle) 31 for discharging (spraying) liquid material or cleaning solution into the vaporizer 11 is placed on the top surface of the vaporizer 11. A liquid supplying pipe 41 for supplying liquid material and a gas supplying pipe 42 for supplying purifying gas, for example, nitrogen ($N_2$) gas, as carrier gas of the liquid material are connected from the outside (upper side) via respective valves V. In the liquid supplying pipe 41, a flow rate regulator (liquid mass flow controller) 41a is disposed in the upstream of the vaporizer 11 (that is, at the side of raw material repository 14).

A heater (not shown) for vaporizing the liquid material discharged into the vaporizer 11 is buried in the inner wall of the vaporizer 11, thereby forming an internal region of the vaporizer 11 as a heating chamber 11a. A taking-out port 32 for taking out process gas obtained by vaporization of the liquid material in the vaporizer 11 is provided in the side of a lower end of the vaporizer 11, and a base end of the gas injector 23 is connected to a gas raw material supplying pipe 35 extending from the taking-out port 32. A vent pipe 36 connected to the exhaust pipe 25 is connected to the gas raw material supplying pipe 35 via a valve V. A buried cylindrical heat exchanger 33 of the heater (not shown) is placed to face the nozzle 31 within the vaporizer 11. In FIG. 1, reference numeral 34 denotes a drain hole for discharging droplets, which are not vaporized in the vaporizer 11 and falls on the floor of the vaporizer 11, to a discharging part, and V denotes a valve. In FIG. 1, reference numeral 16a denotes a flow rate regulator. A vaporization system 30 is constituted by the vaporizer 11, the valves V at the side of the vaporizer 11, which are provided in the liquid supplying pipe 41 and the gas supplying pipe 42, respectively, and the flow rate regulator 41a.

Subsequently, the above-mentioned raw material supplying device 13 will be described in detail. The raw material repository 14 storing the liquid material is placed below the reaction tube 12 and the vaporizer 11, for example, in the underground, like the vacuum pump 27 in order to make a foot print of the device as small as possible. Accordingly, the raw material supplying device 13 is configured to deliver the liquid material from the underground to the vaporizer 11, as will be described later. A supplying pipe 14a connected to the lower part of the raw material supplying pipe 15 is placed in the raw material repository 14 and a lower end of the supplying pipe 14a is opened in a portion lower than a liquid level of the raw material supplying pipe 15. In the underground are placed a gas repository 16 storing the above-mentioned purifying gas (purge gas) supplied into the raw material supplying pipe 15 and a cleaning solution repository (supplying part) 17 storing the cleaning gas such as octane or the like in order to easily and quickly remove liquid from the raw material supplying pipe 15 for maintenance of the device. An auxiliary storage tank 17a storing the cleaning solution is provided to be adjacent to the raw material repository 14 in order to supply the cleaning solution into the supplying pipe 14a. In FIG. 1, reference numeral 7 denotes a liquid feeding gas line for pumping the liquid material toward the supplying pipe 14a by supplying He gas or the like to a portion higher than the liquid level in the raw material supplying pipe 15 and reference numeral 8 denotes an auxiliary cleaning solution supplying pipe for supplying the cleaning solution from the auxiliary storage tank 17a to the supplying pipe 14a. In FIG. 1, reference numeral 9 denotes an auxiliary gas supplying pipe for supplying the purifying gas from the gas repository 16 to the supplying pipe 14a and reference numeral 10 denotes a filter for removing water from the purifying gas.

A plurality (for example, four) of liquid removal mechanisms, each of which includes a plurality of valves, is provided in the raw material supplying device 13. As shown in FIG. 1, the liquid removal mechanisms are respectively disposed in the side of the raw material repository 14 and the vaporizer 11 in the raw material supplying pipe 15, the side of the cleaning solution repository 17 in a cleaning solution supplying pipe (cleaning fluid supplying pipe) 19 supplying the cleaning solution from the cleaning solution repository 17 to the vaporizer 11, and a first raw material discharging pipe 61 extending from a drainage 60, which is a discharging destination of the liquid material and the cleaning solution, to an upper part (the side of the vaporizer 11). These liquid removal mechanisms in the side of the raw material repository 14, the side of the vaporizer 11 and the side of the drainage 60 are hereinafter called "first liquid removal mechanism 50a," "second liquid removal mechanism 50b" and "third liquid removal mechanism 50c," respectively. The liquid removal mechanism provided in the cleaning solution supplying pipe 19 is also called "first liquid removal mechanism 50a" since it has the same configuration as the first liquid removal mechanism 50a. In FIG. 1, the valves of these liquid removal mechanisms are schematically (enlarged) shown to be simplified. In addition, since the first liquid removal mechanism 50a is placed near the floor in actuality, the supplying pipe 14a between the raw material repository 14 and the first liquid removal mechanism 50a is significantly shorter than the raw material pipe 15 extending form the first liquid removal mechanism 50a to the second liquid removal mechanism 50b, although FIG. 1 schematically shows a length dimension of the supplying pipe 14a and the raw material supplying pipe 15.

The valves used in these liquid removal mechanisms include 2-way valves 18a configured to open/close a vertically extending passage 53 and 3-way valves 18b formed with the vertically extending passage 53 and other passage (bypass passage 54) connected from the lateral side of the passage 53. The 3-way valves 18b are configured to switch between an open state where the passage 53 and the bypass passage 54 communicate to each other and a close state where one of an opening end of a lower part of the passage 53 and an opening end of the bypass passage 54 is closed. The 2-way valves 18a and the 3-way valves 18b are implemented with electromagnetic valves which can be opened/closed by an instruction from a control unit 1 which will be described later.

Each of the first liquid removal mechanisms 50a is provided with two 2-way valves 18a and one 3-way valve 18b and the second liquid removal mechanism 50b is provided with one 2-way valve 18a and five 3-way valves 18b. The third liquid removal mechanism 50c is provided with one 2-way valve 18a and two 3-way valves 18b. Valves in portions other than the liquid removal mechanisms 50 are denoted by "V" as described above, and distinguished from valves (valves 71 to 82 which will be described later) constituting the liquid removal mechanisms.

Figure 2:
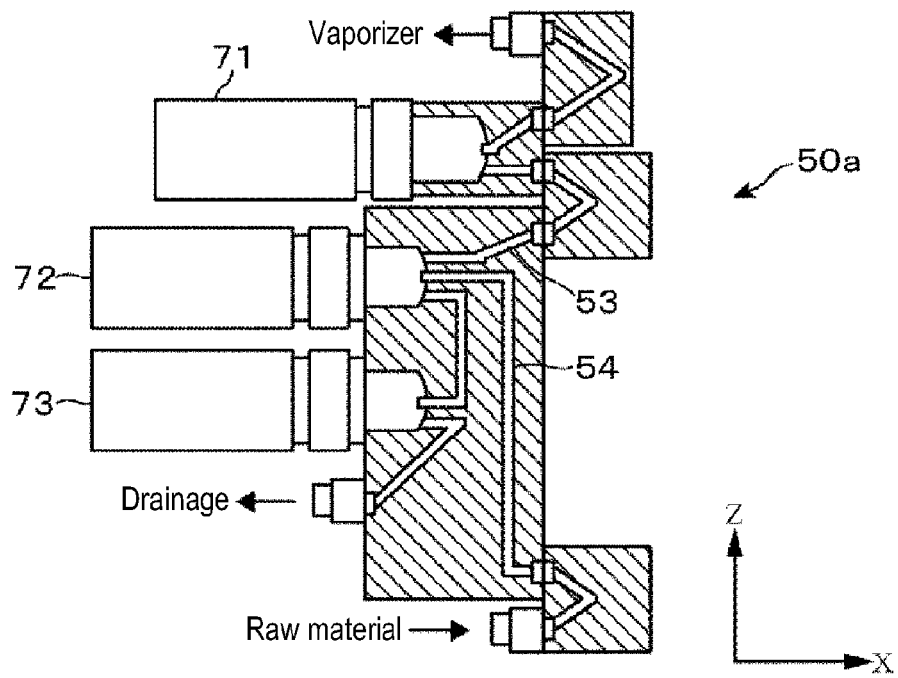
FIG. 2 is a longitudinal sectional view showing a first liquid removal mechanism in the raw material supplying device.
Figure 3:
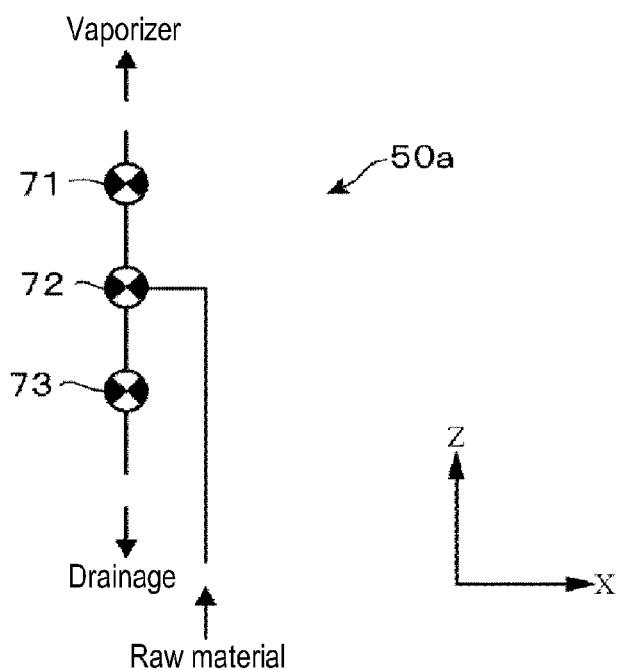
FIG. 3 is a schematic view of the first liquid removal mechanism.

Subsequently, a layout of the valves in the liquid removal mechanisms will be described in more detail. First, the first liquid removal mechanism 50a will be described. As shown in FIG. 2, the first liquid removal mechanism 50a includes a valve 71 constituted by a 2-way valve 18a, a first raw material supplying valve 72 constituted by a 3-way valve 18b, and a first raw material discharging valve 73 constituted by a 2-way valve 18a, which are arranged in order from top to bottom. One end (lower end) of the raw material supplying pipe 15 and the first raw material discharging pipe 61 are connected to an upper end of the valve 71 and a lower end of the first raw material discharging valve 73, respectively. FIG. 3 schematically shows the first liquid removal mechanism 50a.

Figure 4:
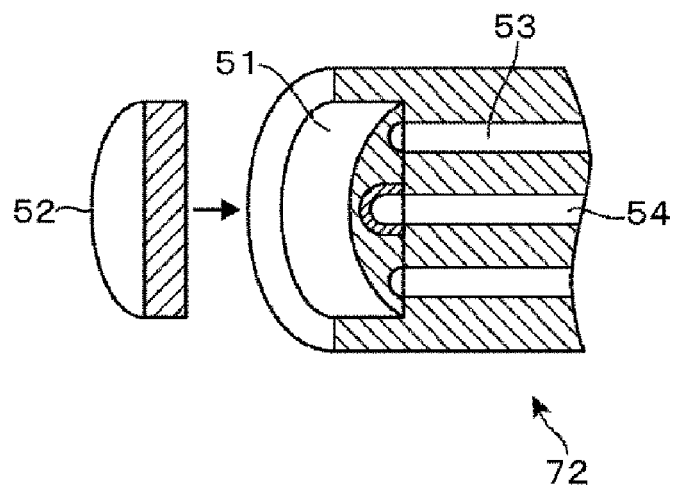
FIG. 4 is a schematic sectional view showing a 3-way valve used in the raw material supplying device.
Figure 5:
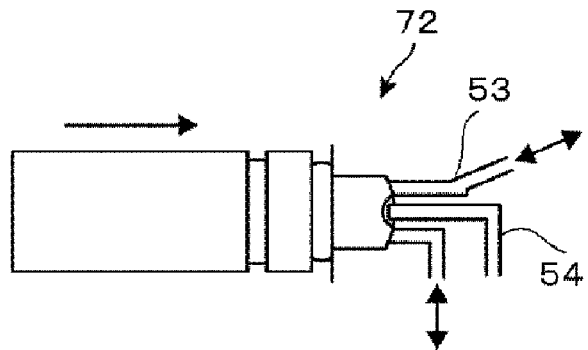
FIG. 5 is a schematic view showing a state where a passage of the 3-way valve is closed.
Figure 6:
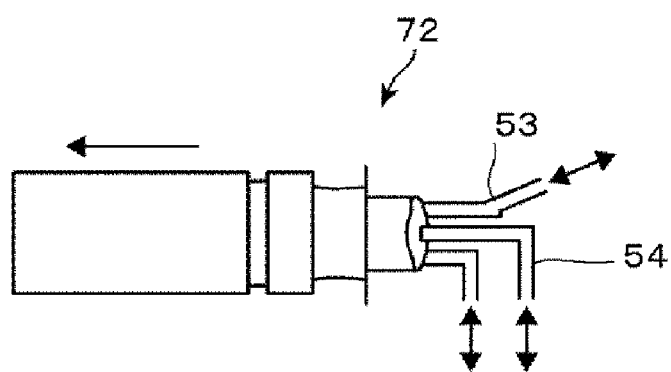
FIG. 6 is a schematic view showing a state where a passage of the 3-way valve is opened.

As schematically shown in FIG. 4, the first raw material supplying valve 72 is formed with the vertically extending passage 53 via a valve room 51 of the first raw material supplying valve 72, and the above-mentioned valve 71 and first raw material discharging valve 73 are connected to the upper end and lower end of the passage 53, respectively. One end of the bypass passage 54 is openably/closably opened by a valve body 52 in the valve room 51 and the other end of the bypass passage 54 is bent downward and connected to the supplying pipe 14a at a position lower than the first raw material discharging valve 73. Accordingly, under a state where the first raw material supplying valve 72 is closed (a state where an opening end of the bypass passage 54 is blocked by the valve body 52), the supply of the liquid material from the supplying pipe 14a is stopped as shown in FIG. 5, whereas, under a state where the first raw material supplying valve 72 is opened, the liquid material is supplied into the valve room 51 as shown in FIG. 6. By opening/closing the valve 71 and the first raw material discharging valve 73 along with the first raw material supplying valve 72, the liquid material is supplied into the side of the vaporizer 11 (the side of the second liquid removal mechanism 50b) or the liquid material is discharged out of the vaporizer 11. The upper end of the valve 71, the lower end of the first raw material discharging valve 73 and the opening end in the lower end of the bypass passage 54 are arranged to face the same direction (the left side in FIG. 2).

The first liquid removal mechanism 50a is also provided in the side of the cleaning solution repository 17 in the cleaning solution supplying pipe 19, and supplying pipes 19a extending respectively from the cleaning solution supplying pipe 19 and the cleaning solution repository 17 are connected to the upper end of the valve 71 and the bypass passage 54 of the first raw material supplying valve 72, respectively. The above-mentioned first raw material discharging pipe 61 is connected to the lower end of the first raw material discharging valve 73.

Figure 7:
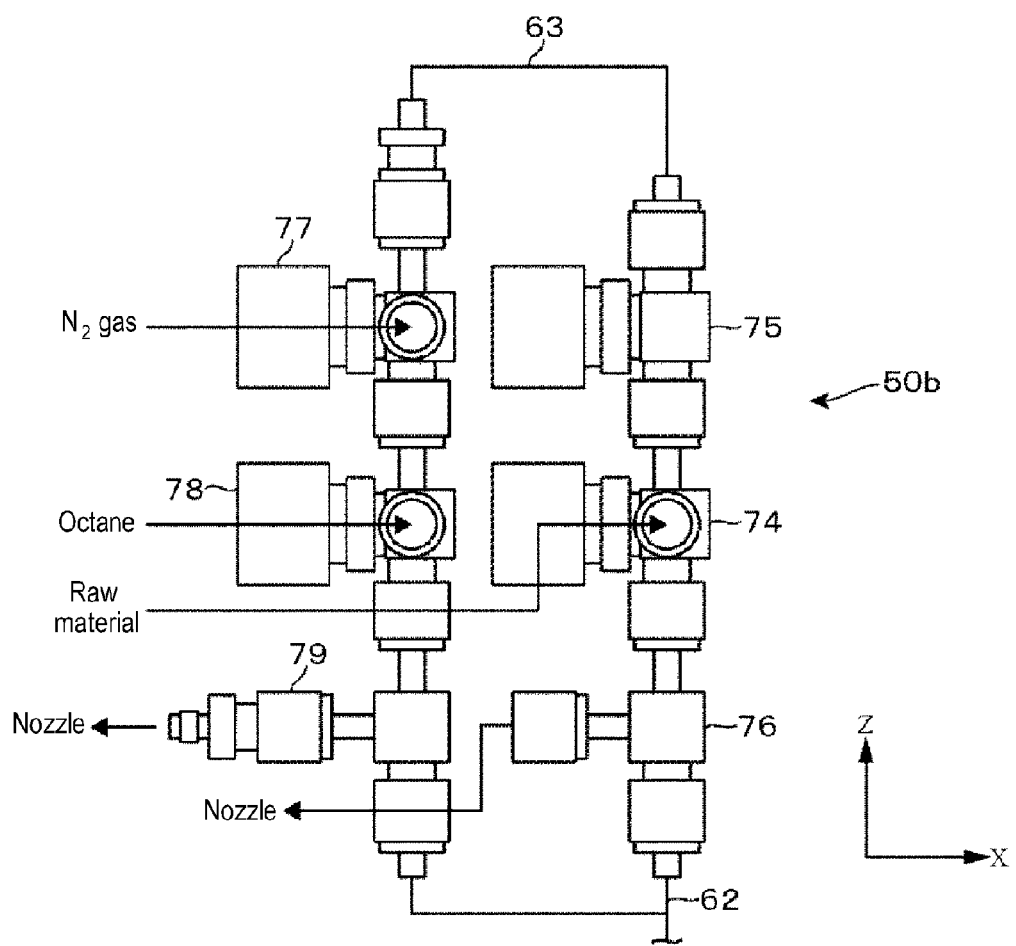
FIG. 7 is a longitudinal sectional view showing a second liquid removal mechanism in the raw material supplying device.
Figure 8:
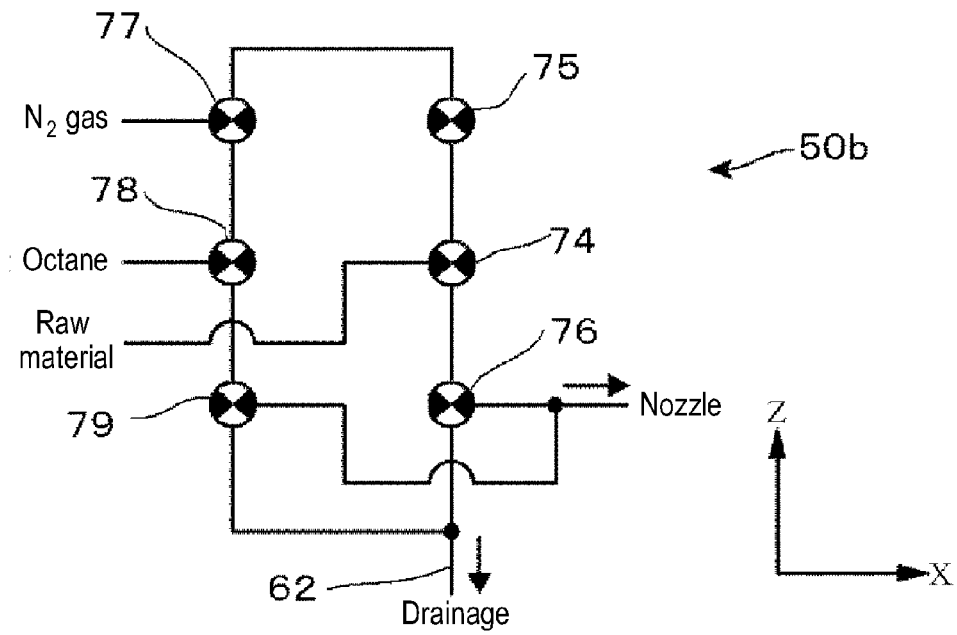
FIG. 8 is a schematic view of the second liquid removal mechanism.

Subsequently, the second liquid removal mechanism 50b will be described with reference to FIGS. 7 and 8. The second liquid removal mechanism 50b is configured to supply purifying gas into the raw material supplying pipe 15 from an upper side and discharge the liquid material and the cleaning solution to a lower side. That is, the second liquid removal mechanism 50b is connected with the raw material supplying pipe 15, the cleaning solution supplying pipe 19 and the gas supplying pipe 43 extending from the gas repository 16, and includes five 3-way valves 18b and one 2-way valve 18a arranged such that the opening end of the gas supplying pipe 43 is located above the opening ends of the raw material supplying pipe 15 and the cleaning solution supplying pipe 19.

Specifically, the second liquid removal mechanism 50b includes a vertically extending passage 53 and a second raw material supplying valve 74 constituted by a 3-way valve 18b comprising a bypass passage 54 connected from the lateral side of the passage 53, like the above-described first raw material supplying valve 72. The other end (upper end) of the raw material supplying pipe 15 is connected to the bypass passage 54 of the second raw material supplying valve 74 and a lower end of a cleaning solution supplying valve 75 constituted by a 2-way valve 18a is connected to the upper end of the passage 53 of the second raw material supplying valve 74. An upper end of a passage 53 in a second raw material discharging valve 76 constituted by a 3-way valve 18b is connected to the lower end of the passage 53 of the second raw material supplying valve 74. The above-mentioned liquid supplying pipe 41 is connected to a bypass passage 54 in the second raw material discharging valve 76 via a discharging valve V and a second raw material discharging pipe 62 extending toward the third liquid removal mechanism 50c is connected to the lower end of the passage 53 of the second raw material discharging valve 76.

One end (upper end) of a passage 53 of a gas supplying valve 77 constituted by a 3-way valve 18b is connected to the upper end of the cleaning solution supplying valve 75 via a pipe (cleaning solution supplying pipe) 63 and both ends of the pipe 63 are bent downward such that the one end of the passage 53 directs upward. An upper end of a passage 53 in a cleaning solution supplying valve 78 constituted by a 3-way valve 18b is connected to the other end (lower end) of the passage 53 of the gas supplying valve 77 and the gas supplying pipe 43 is connected to a bypass passage 54 of the gas supplying valve 77. An upper end of a passage 53 in a valve 79 constituted by a 3-way valve 18b is connected to the lower end of the passage 53 of the cleaning solution supplying valve 78 and the cleaning solution supplying pipe 19 is connected to a bypass passage 54 of the cleaning solution supplying valve 78. The above-mentioned second raw material discharging pipe 62 also used as a cleaning solution discharging pipe is connected to the lower end of the passage 53 of the valve 79 and a branch pipe 44 branching and extending from the liquid supplying pipe 41 is connected to a bypass passage 54 of the valve 79. These valves 74, 77 and 78 are each configured such that their passages 53 and bypass passages 54 communicate to each other in their opened state while their bypass passages 54 are closed in their closed state. The valves 76 and 79 are each configured such that their passages 53 and bypass passages 54 communicate to each other in their opened state while their downward-directing passages 53 are closed (i.e., the upper ends of the passages 53 communicate to the bypass passages 54) in their closed state. FIG. 8 schematically shows the second liquid removal mechanism 50b shown in FIG. 7. In FIG. 7, the second liquid removal mechanism 50b is shown to be horizontally reversed to that of FIG. 1

Figure 9:
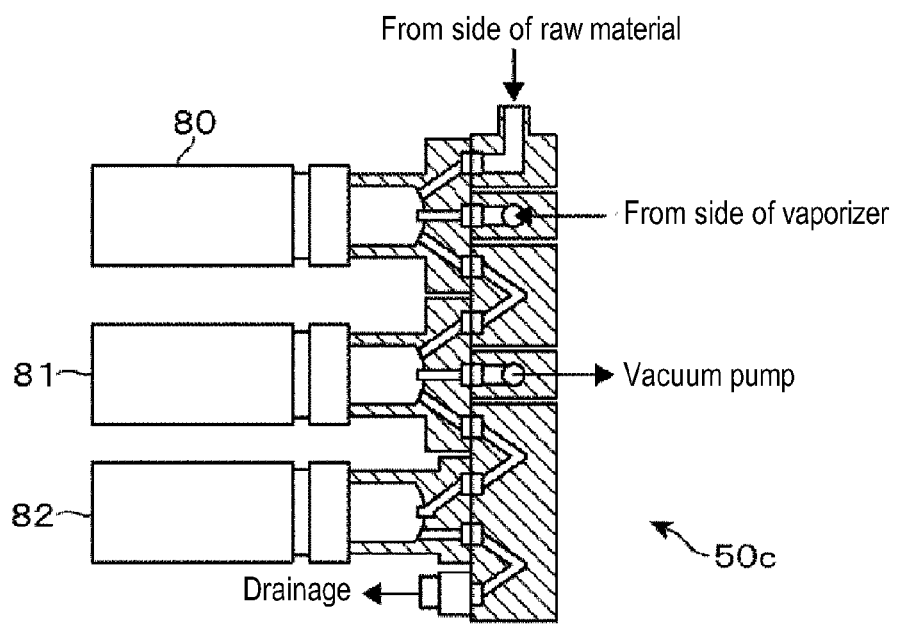
FIG. 9 is a longitudinal sectional view showing a third liquid removal mechanism in the raw material supplying device.
Figure 10:
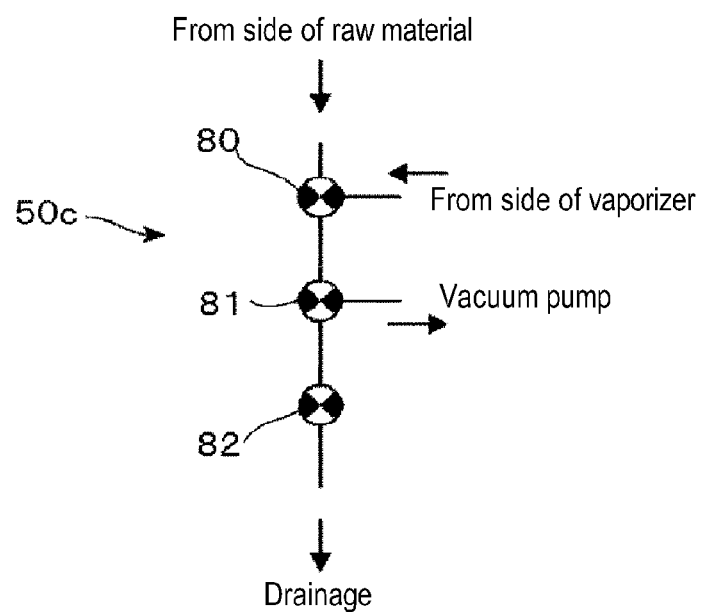
FIG. 10 is a schematic view of the third liquid removal mechanism.

Subsequently, the third liquid removal mechanism 50c will be described with reference to FIG. 9. The third liquid removal mechanism 50c includes a first fluid discharging valve 80 constituted by a 3-way valve 18b, a drainage suction valve 81 constituted by a 3-way valve 18b, and a second fluid discharging valve 82 constituted by a 2-way valve 18a, which are arranged in order from top to bottom, and passages 53 of the valves 80 to 82 are formed to extend vertically. The first raw material discharging pipe 61 is connected to an upper end of the first fluid discharging valve 80 and the second raw material discharging pipe 62 directing from the second liquid removal mechanism 50b to a lower part is connected to a bypass passage 54 of the first fluid discharging valve 80. A vacuum pump 56 as an exhaustion mechanism is connected to a bypass passage 54 of the drainage suction valve 81 via a pressure regulator 55 such as a butterfly valve or the like. The drainage 60 is connected to a lower end of the second fluid discharging valve 82. These valves 80 and 81 are each configured such that their passages 53 and bypass passages 54 communicate to each other in their opened state while their bypass passages 54 are closed in their closed state. FIG. 10 schematically shows the third fluid removal mechanism 50c.

A valve V is disposed in the first raw material discharging pipe 61 between the third fluid removal mechanism 50c and the above-described first fluid removal mechanism 50a and one ends of drain pipes 64 discharging liquid out of the first raw material discharging pipe 61 are connected to the side of the third liquid removal mechanism 50c and the first fluid removal mechanism 50a via valves V, respectively. The other ends of these drain pipes 64 are connected to a drain tank 65 together. A pressure detector 66 for measuring an internal pressure of the first raw material discharging pipe 61 is disposed in the first raw material discharging pipe 61 in the side of the third fluid removal mechanism 50c other than these drain pipes 64. As will be described later, based on an output value of the pressure detector 66, it is determined by the control unit 1 whether or not liquid within the raw material supplying pipe 15, the cleaning solution supplying pipe 19, the first raw material discharging pipe 61 and the second raw material discharging pipe 62 has been completely removed (or liquid has been individually removed from the exteriors of the raw material supplying pipe 15, the cleaning solution supplying pipe 19, the first raw material discharging pipe 61 and the second raw material discharging pipe 62). Liquids such as the above-mentioned liquid material, cleaning solution and drain are collected in one site (in the underground) below the reaction tube 12 and the vaporizer 11, for example, in reality, although they are separately shown in FIG. 1.

This vertical heat processing apparatus is provided with a valve opening/closing device 5 for outputting signals to open/close various valves, and the control unit 1 implemented with a computer for controlling the entire operation of the apparatus including the valve opening/closing device 5. In a memory of the control unit 1 are stored a film forming program for supplying process gas obtained by vaporizing the liquid material in the vaporizer 11 into the reaction tube 12 and performing a film forming process for the wafer W, and a liquid removal program for removing liquid from the raw material supplying pipe 15 for maintenance of a device (for example, the vaporizer 11) or exchange of the raw material repository 14, for example. These programs are installed from a storage unit 2, which is a storage medium such as a hard disk, compact disk, magneto-optical disk, memory card, flexible disk or the like, into the control unit 1.

Next, operation of the above-described embodiment will be described. First, a process of forming films on wafers W in the reaction tube 12 will be described. Initially, an empty wafer boat 21 is positioned below the reaction tube 12 and, at the same time, a plurality of wafers W are loaded on the wafer boat 21 in the form of a shelf by means of a carrying arm (not shown). Subsequently, the wafer boat 21 is airtightly inserted in the reaction 12 tube, the interior of the reaction tube 12 is vacuumized by the vacuum pump 27 to set a process pressure, and the wafers W are heated while the wafer boat 21 is being rotated. In addition, the vaporizer 11 is heated to vaporize the liquid material in the vaporizer 11.

Figure 11:
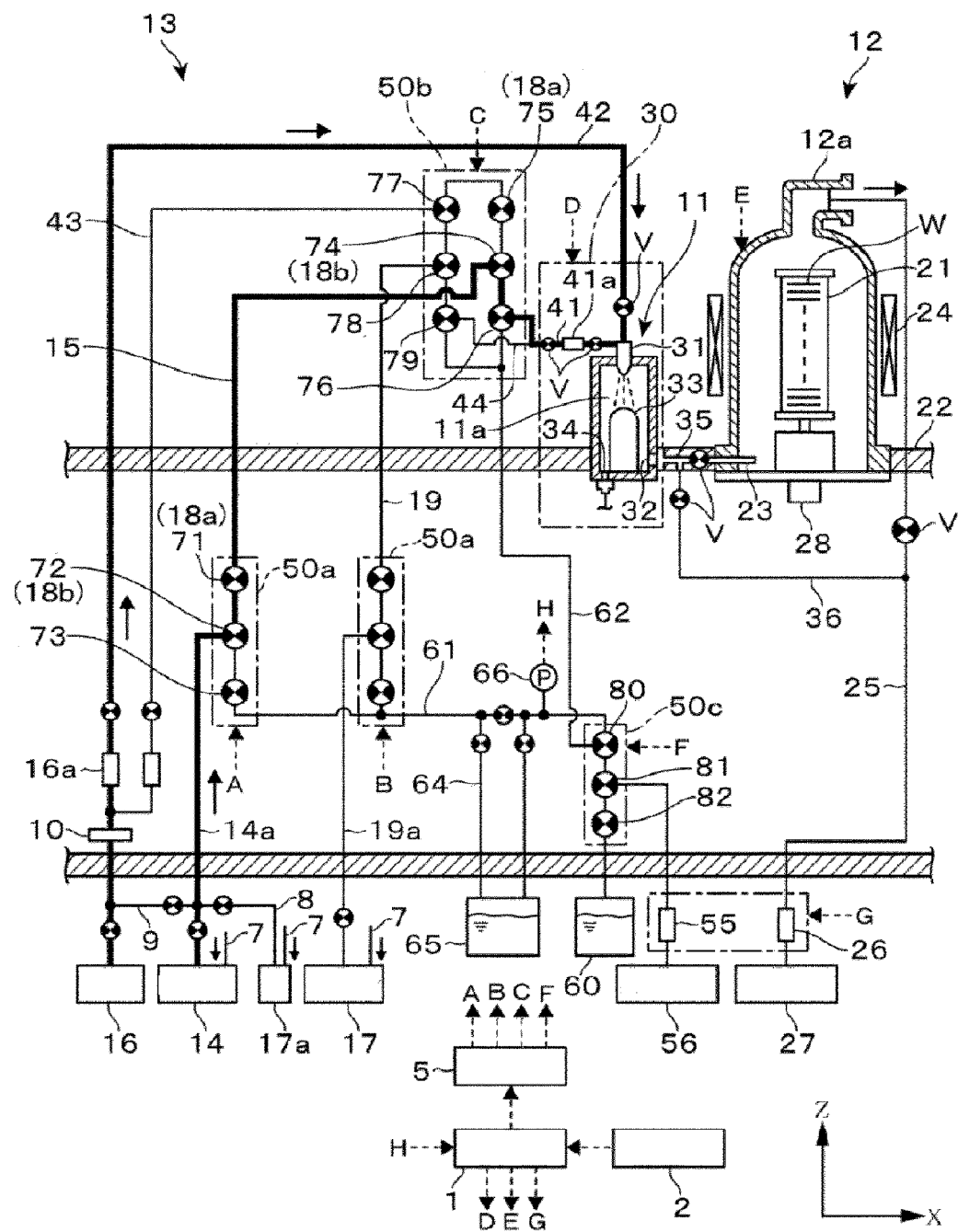
FIG. 11 is a schematic view showing an operation of the raw material supplying device.
Figure 12:
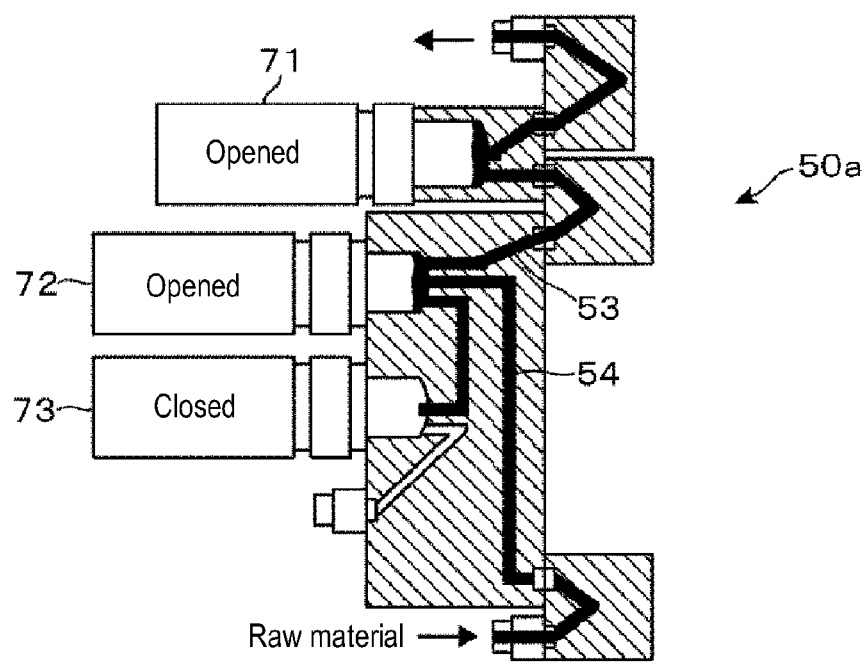
FIG. 12 is a schematic view showing an operation of the raw material supplying device.

Subsequently, as shown in FIG. 11, while purifying gas as carrier gas is being supplied from the gas repository 16 into the heating chamber 11a of the vaporizer 11, gas is supplied from the liquid feeding gas line 7 into the raw material repository 14 and then liquid material is supplied into the nozzle by means of the raw material supplying pipe 15 via the first liquid removal mechanism 50a and the second liquid removal mechanism 50b. That is, as shown in FIG. 12, in the first liquid removal mechanism 50a, the first raw material discharging valve 73 is set to a closed state while the valve 71 and the first raw material supplying valve 72 are set to an opened state. Accordingly, as indicated by thick lines in FIG. 12, with the liquid material filled in the bypass passage 54, the passage 53 between the first raw material supplying valve 72 and the first raw material discharging valve 73, and the passage 53 extending from the first raw material supplying valve 72 and the upper end of the valve 71, the liquid material is rising from the upper end of the valve 71 toward the second liquid removal mechanism 50b. In FIG. 12, the opened and closed states of each valve 71 to 73 are indicated by circles describing "opened" or "closed." In FIGS. 11 and 12, places where fluid (the purifying gas or the liquid material) flows are indicated by thick lines. FIG. 11 schematically shows the apparatus, which is true of later figures.

Figure 13:
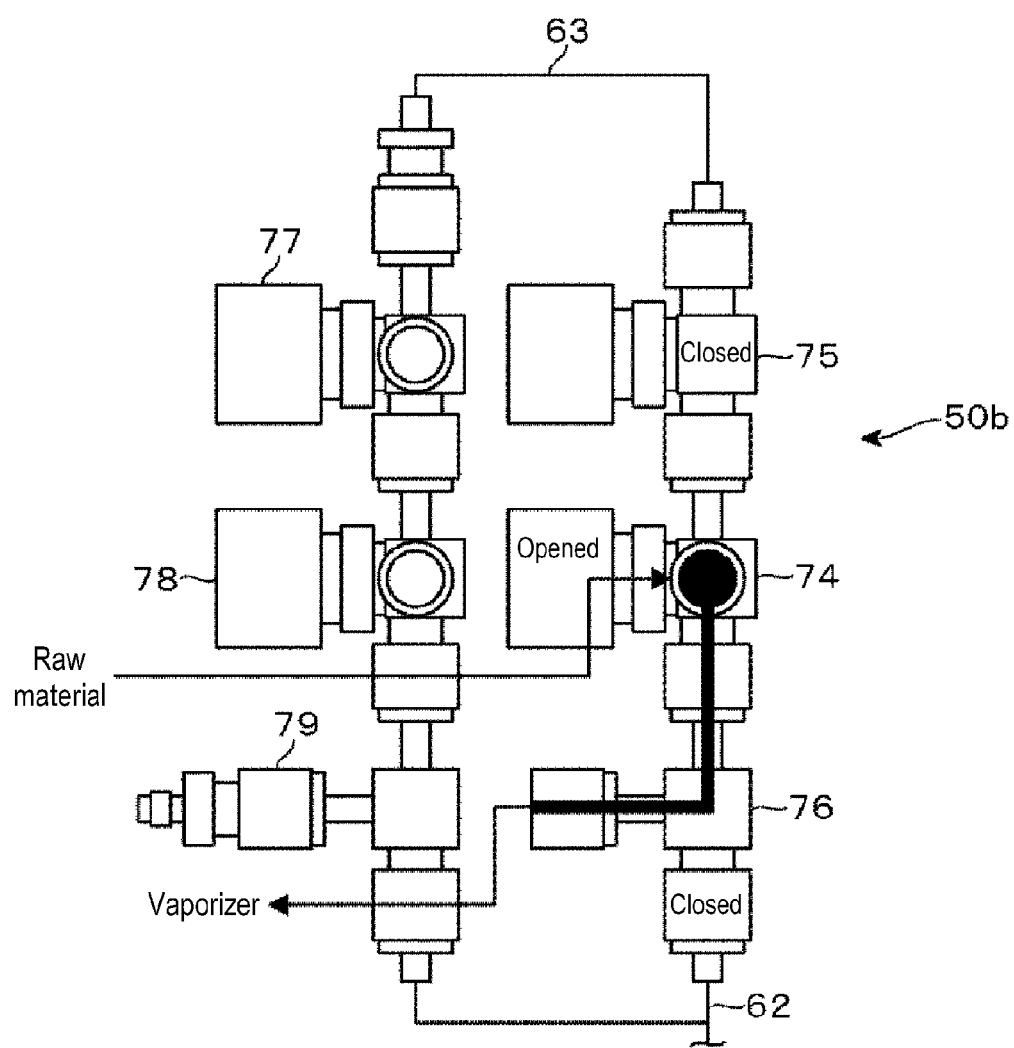
FIG. 13 is a schematic view showing an operation of the raw material supplying device.

As shown in FIG. 13, in the second liquid removal mechanism 50b, the second raw material supplying valve 74 is set to the opened state while the cleaning fluid supplying valve 75 and the second raw material discharging valve 76 are set to the closed state. The liquid material supplied from the first liquid removal mechanism 50a to the second liquid removal mechanism 50b falls from the second raw material supplying valve 74 toward the second raw material discharging valve 76 and flows through the liquid supplying pipe 41 toward the nozzle 31 via the bypass passage 54 of the second raw material discharging valve 76 and the discharging valve V. Thus, when the liquid material is sprayed from the nozzle 31 into the vaporizer 11, the liquid material is vaporized by heat generated by a heater (not shown) provided in the inner wall of the vaporizer 11 and, along with the carrier gas, flows into the reaction tube 12 via the taking-out port 32 and the gas injector 23. When the process gas contacts surfaces of the wafers W, the process gas is thermally decomposed, thereby forming thin films made of, for example, zirconium oxide (ZrO), on the surfaces of the wafers W.

Figure 14:
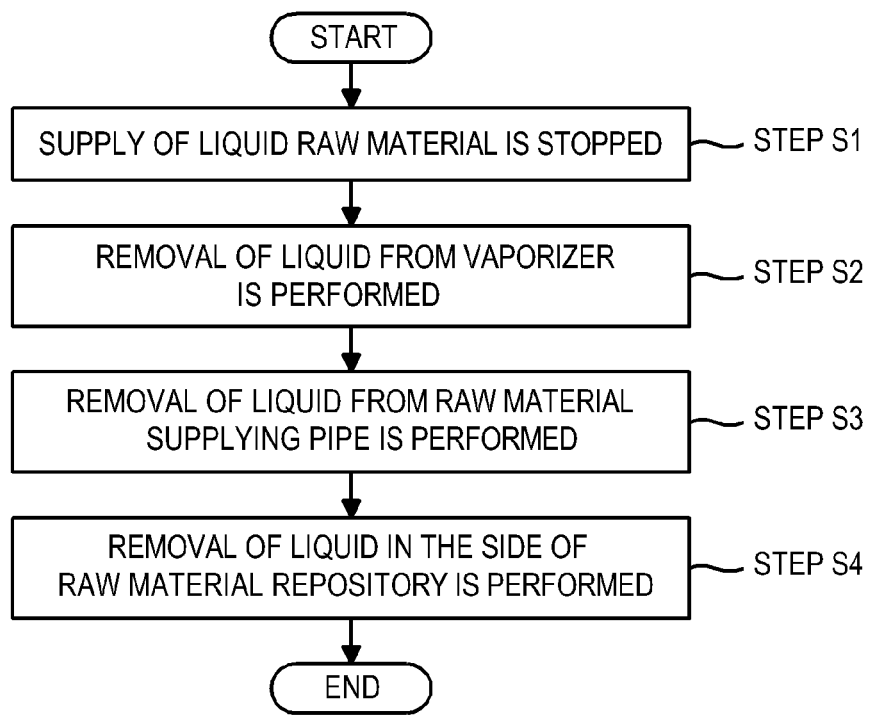
FIG. 14 is a flow chart showing a liquid removal process in the raw material supplying device.

Subsequently, when the film forming process is completed, the supply of the liquid material into the vaporizer 11 is stopped, that is, for example, the valve V between the vaporizer 11 and the reaction tube 12 is closed while the second raw material supplying valve 74 is closed, thereby vacuumizing the interior of the reaction tube 12 to discharge the process gas. Subsequently, inert gas is supplied from a purge gas source (not shown) into the reaction tube 12 in order to return the interior of the reaction tube 12 to the air atmosphere. Then, the wafer boat 21 is descended to carry the wafers W out of the wafer boat 21 by means of carrying arms (not shown). Thus, after a plurality of batch processes (carrying the wafers W into the wafer boat 21, film forming, and taking the wafers W out of the wafer boat 21) are performed, the liquid material is removed for maintenance of the vaporizer 11 or exchange of film forming species (replacement of the raw material repository 14 with a new one), as will be described below. This removal process will be described in detail below with reference to a flow chart of FIG. 14.

<Removal of Liquid from Vaporizer>

Figure 15:
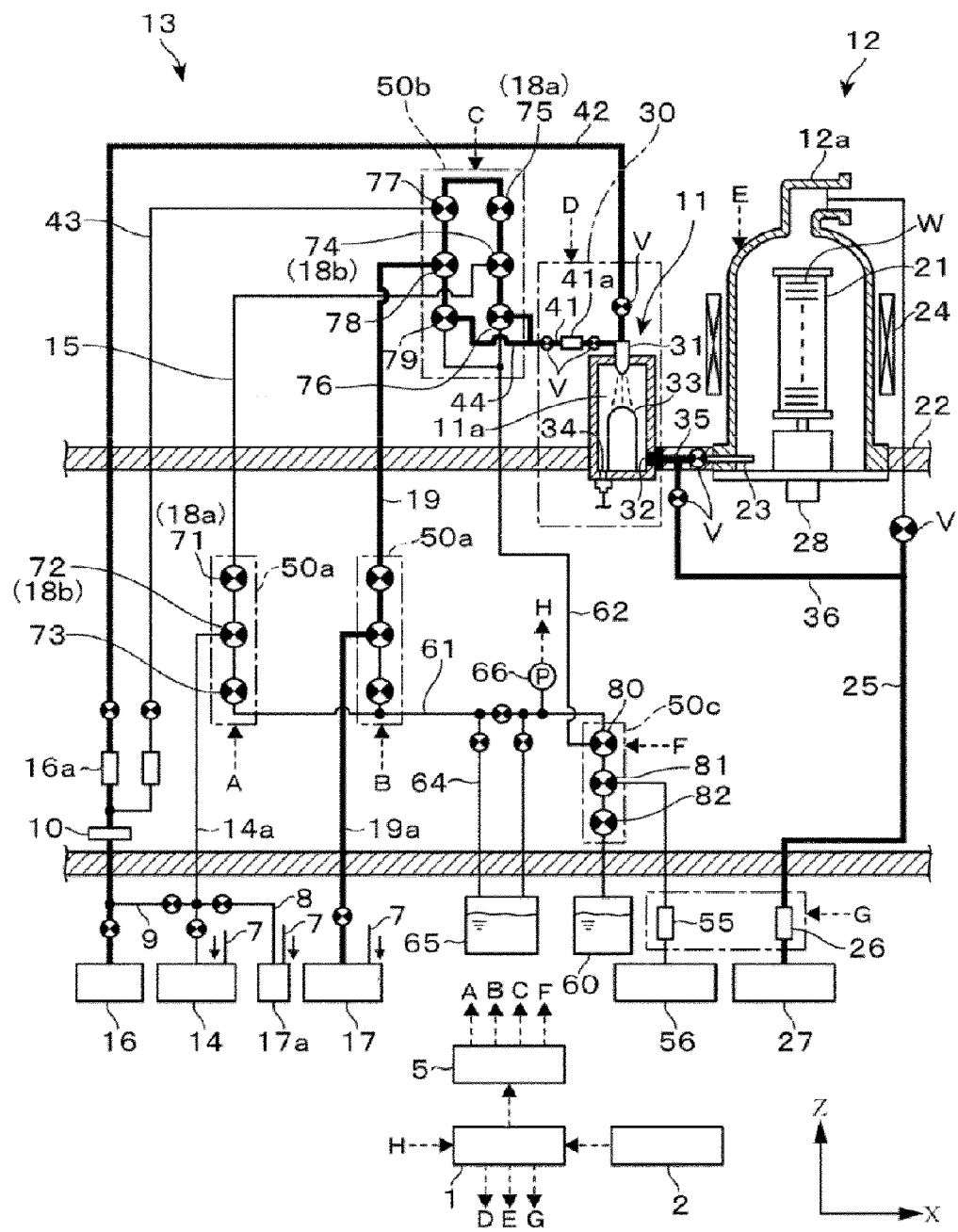
FIG. 15 is a schematic view showing an operation of the raw material supplying device.
Figure 16:
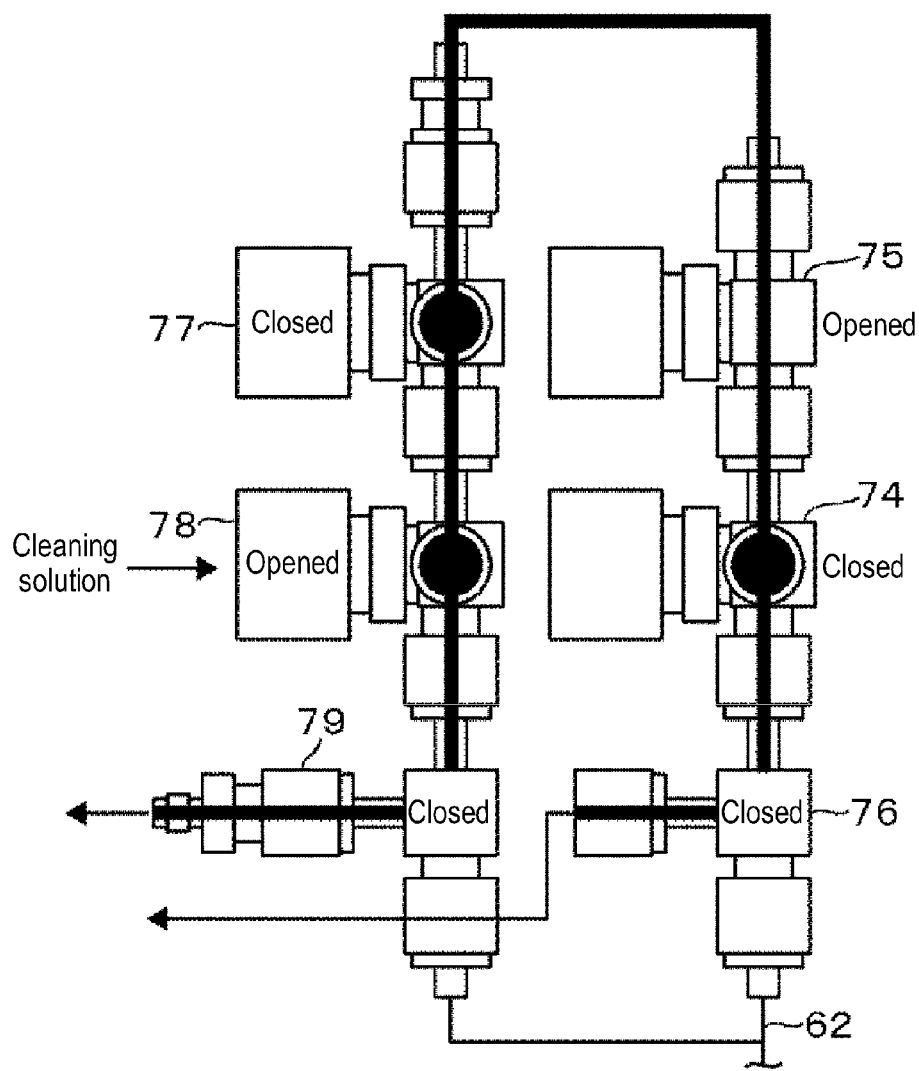
FIG. 16 is a schematic view showing an operation of the raw material supplying device.

First, as shown in FIG. 15, liquid raw material is discharged from the second liquid removal mechanism 50b and the vaporizer 11 by a cleaning solution. That is, supply of the liquid raw material into the second liquid removal mechanism 50b is stopped by closing the second raw material supplying valve 74 (Step S1) and the valve V of the vent pipe 36 is opened while closing the valve V between the vaporizer 11 and the reaction tube 12. In addition, as shown in FIG. 16, the cleaning fluid supplying valve 75 and the cleaning solution supplying valve 78 are opened and the second raw material discharging valve 76, the gas supplying valve 77 and the valve 79 are closed. Liquid raw material remaining in the second liquid removal mechanism 50b is pumped toward the nozzle 31 by the cleaning solution supplied from the cleaning solution supplying pipe 19 and, along with the cleaning solution, is atomized in the vaporizer 11 by purifying gas (carrier gas) supplied from the gas supplying pipe 42. Mixed gas generated by the vaporization of the liquid raw material and the cleaning solution is exhausted toward the vacuum pump 27 via the above-mentioned vent pipe 36.

Figure 17:
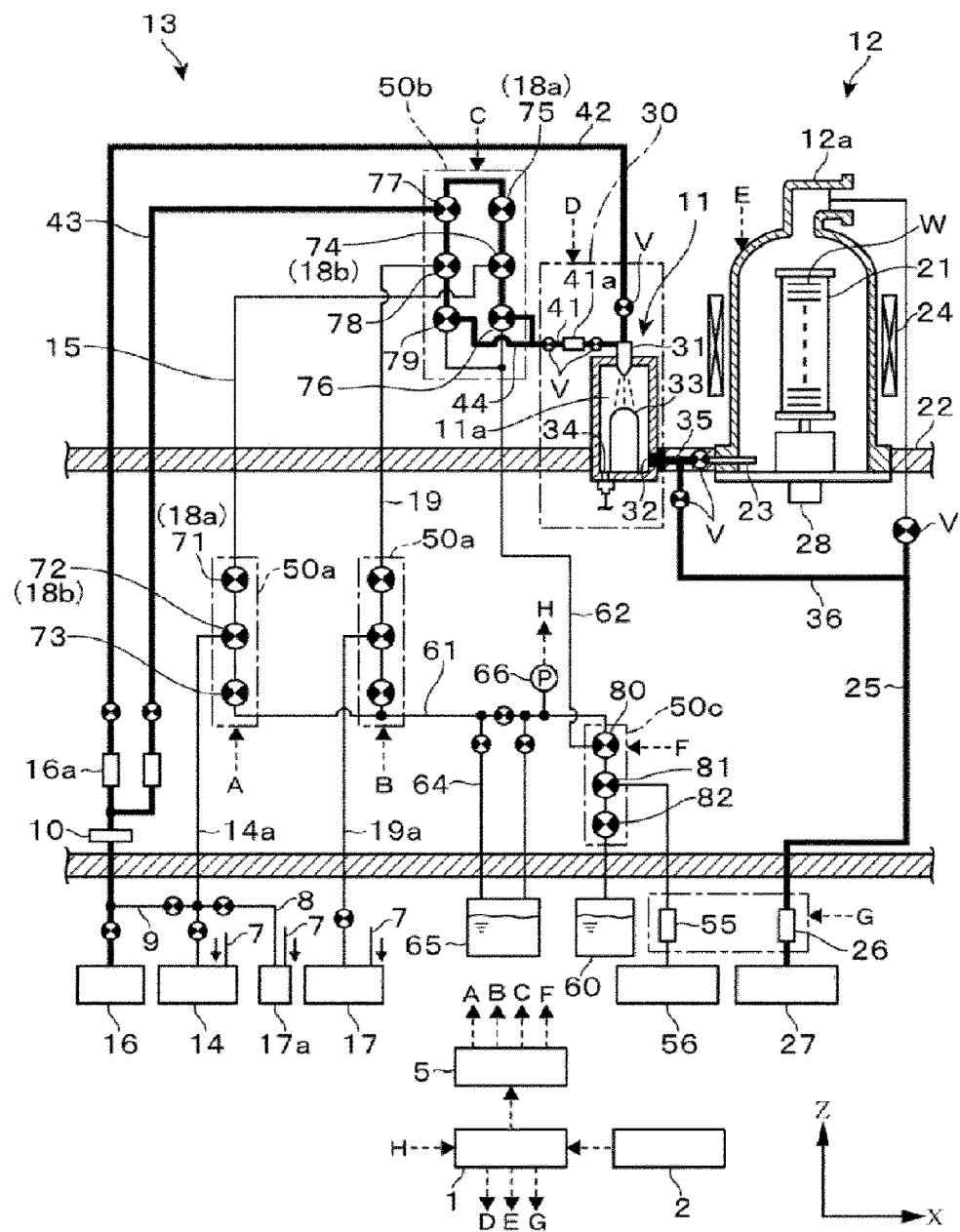
FIG. 17 is a schematic view showing an operation of the raw material supplying device.
Figure 18:
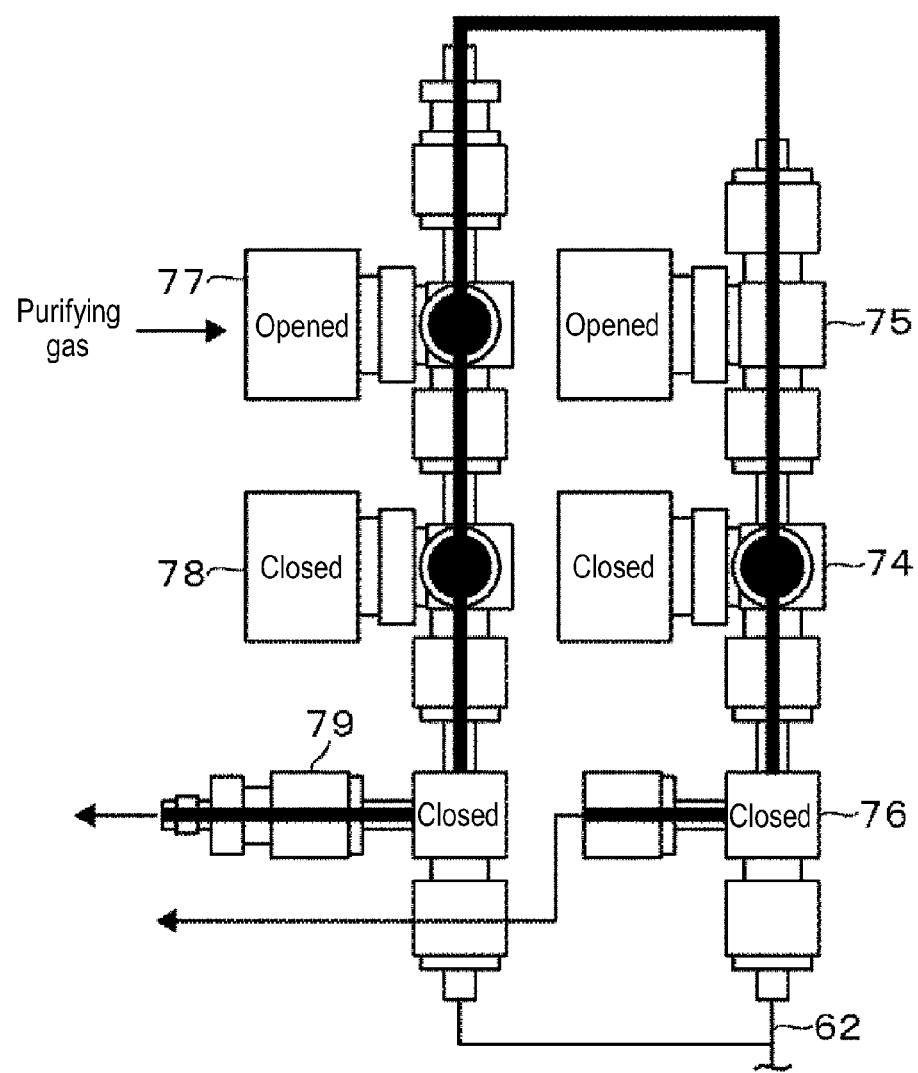
FIG. 18 is a schematic view showing an operation of the raw material supplying device.
Figure 19:
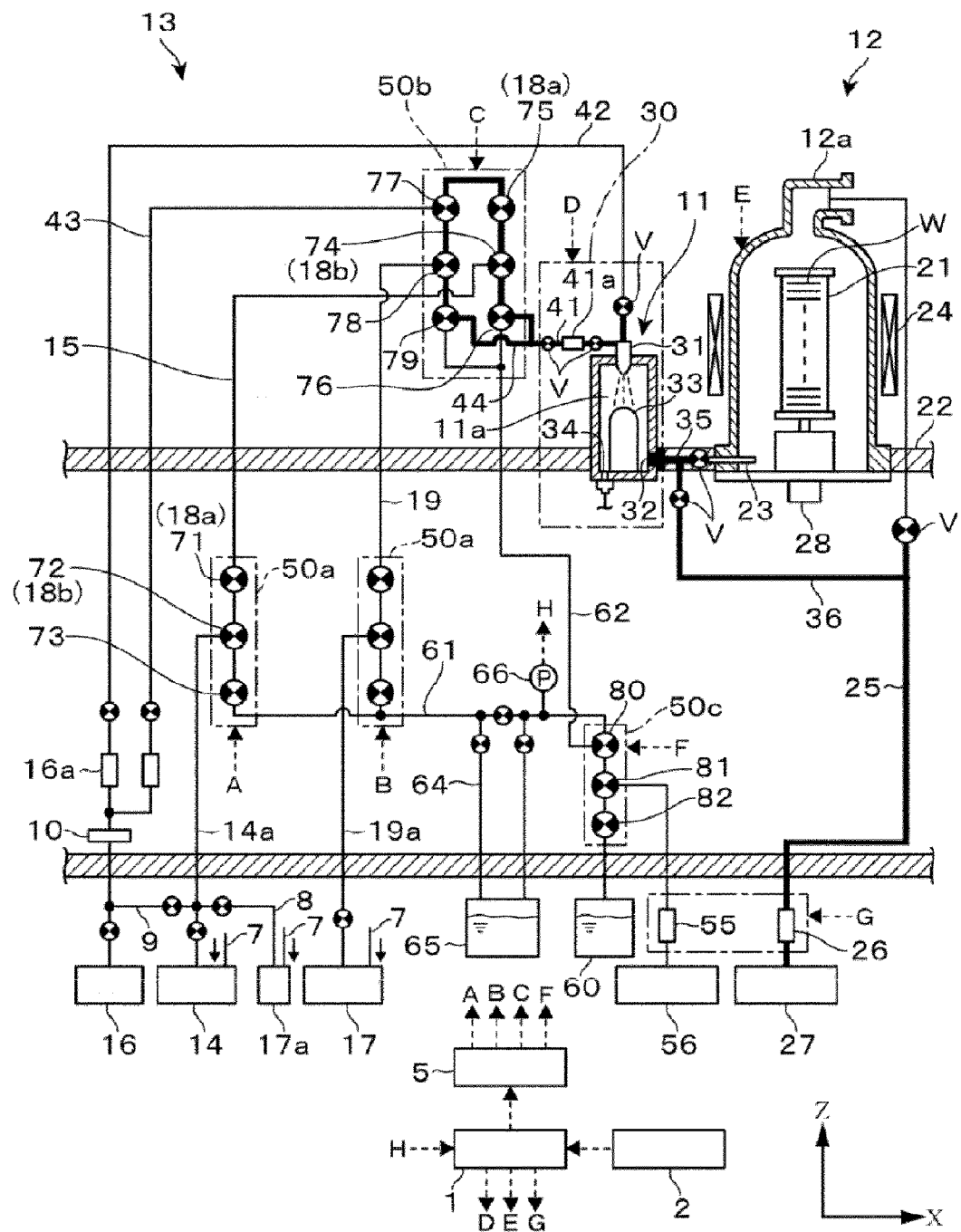
FIG. 19 is a schematic view showing an operation of the raw material supplying device.
Figure 20:
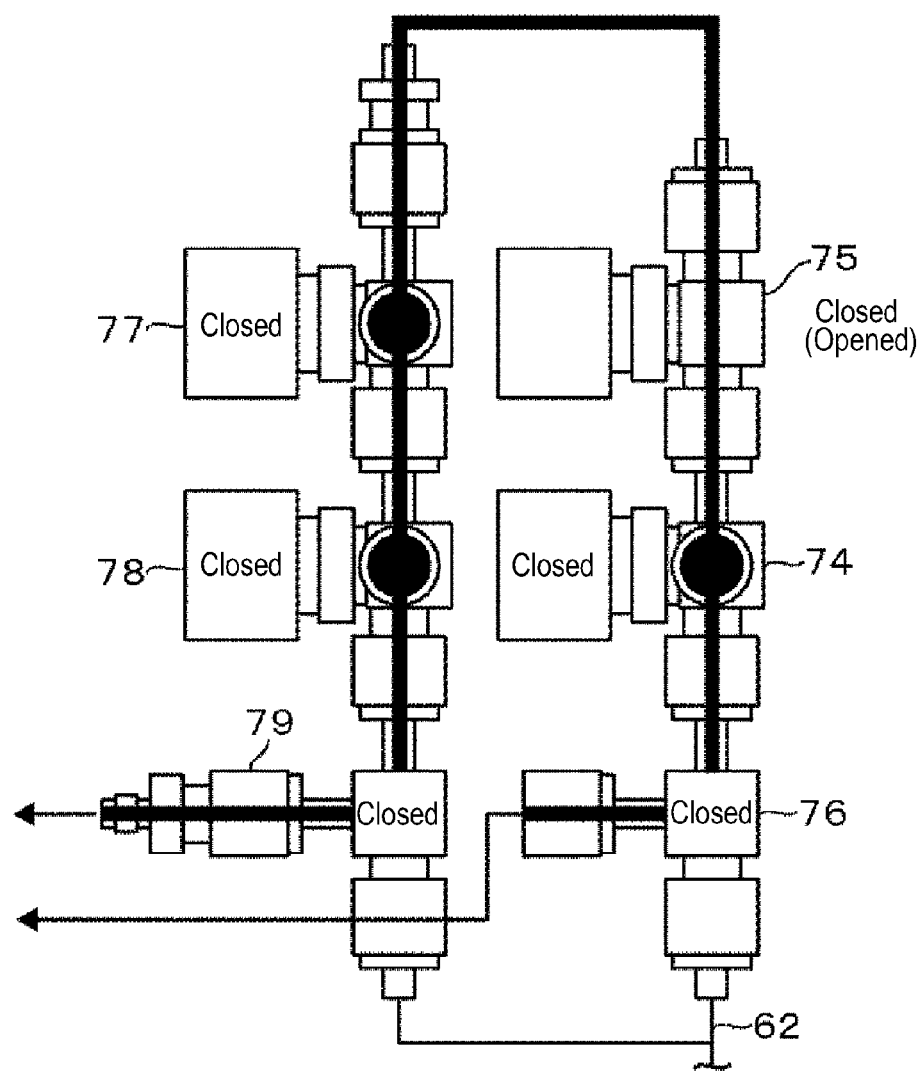
FIG. 20 is a schematic view showing an operation of the raw material supplying device.

Subsequently, as shown in FIGS. 17 and 18, the cleaning solution supplying valve 78 is closed and the gas supplying valve 77 are closed, and a cleaning solution remaining in the second liquid removal mechanism 50b and the vaporizer 11 is discharged to the vacuum pump 27 via the vent pipe 36 by the purifying gas supplied from the gas supplying pipe 43. Then, as shown in FIGS. 19 and 20, the valve V of the gas supplying pipe 42 in the vicinity of the nozzle 31 and the gas supplying valve 77 are closed to vacuumize the interiors of the second liquid removal mechanism 50b and the vaporizer 11. At this time, the cleaning fluid supplying valve 75 may be opened. Subsequently, the supply of the purifying gas into the second liquid removal mechanism 50b and the vaporizer 11 (see FIGS. 17 and 18) and the vacuumization of the interiors of the second liquid removal mechanism 50b and the vaporizer 11 (see FIGS. 19 and 20) are repeated, for example, four times. Thus, the cleaning solution (or a mixture of the cleaning solution and the liquid raw material) is removed out of the interior of the vaporizer 11 and the neighborhood of the vaporizer 11 (the side of the second liquid removal mechanism 50b of the vaporizer 11 and the side of the reaction tube 12).

Figure 21:
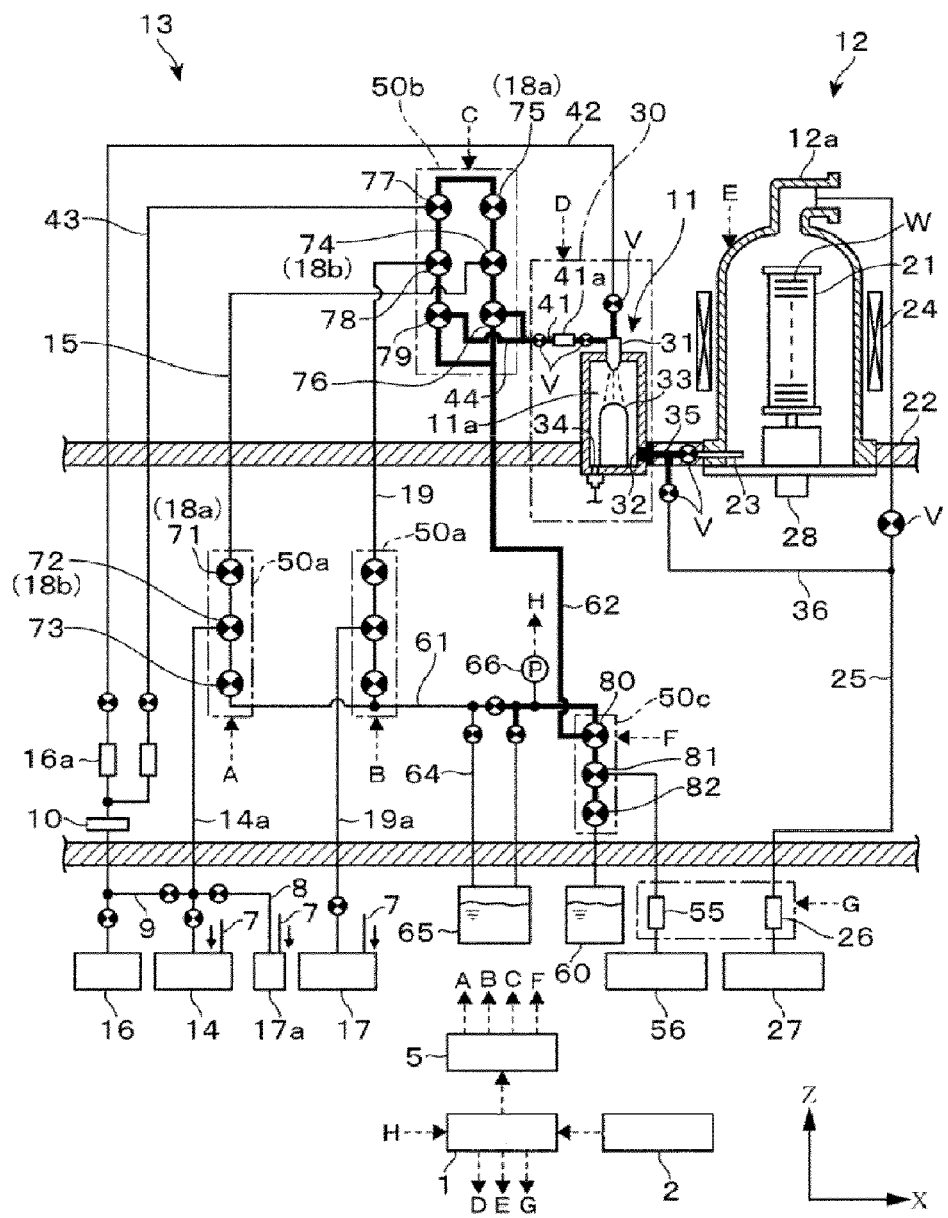
FIG. 21 is a schematic view showing an operation of the raw material supplying device.
Figure 22:
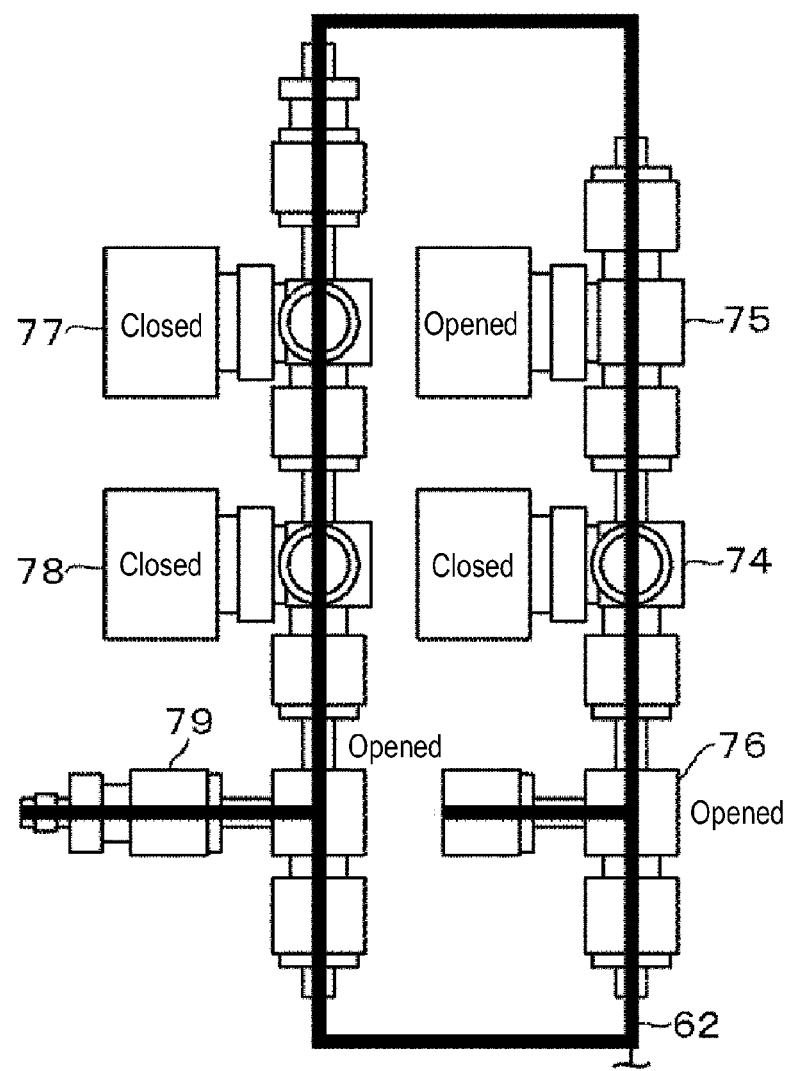
FIG. 22 is a schematic view showing an operation of the raw material supplying device.
Figure 23:
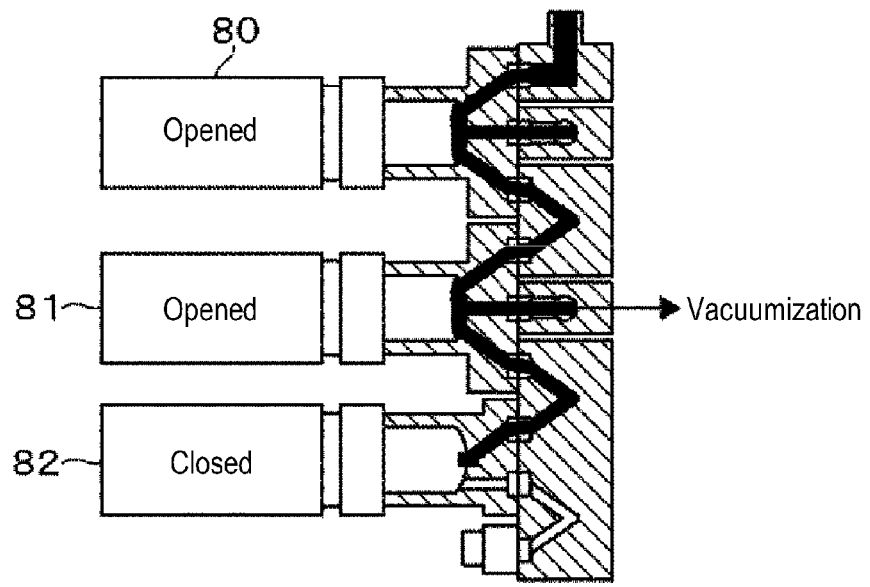
FIG. 23 is a schematic view showing an operation of the raw material supplying device.
Figure 24:
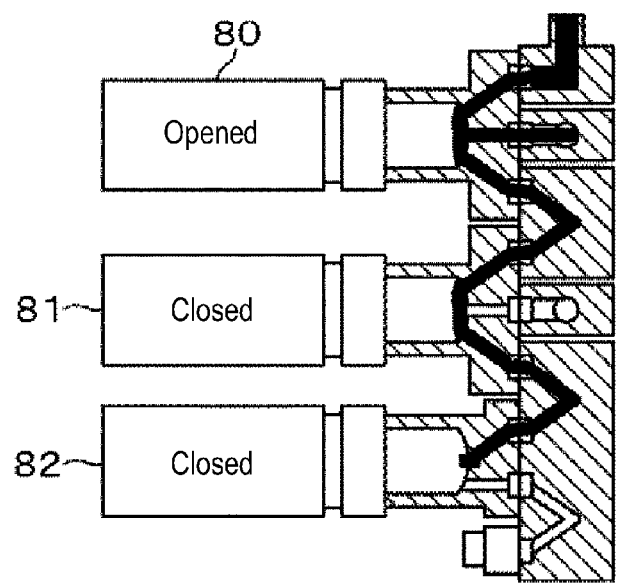
FIG. 24 is a schematic view showing an operation of the raw material supplying device.

Subsequently, it is checked whether or not the removal of liquid out of the vaporizer 11 has been completed. Specifically, as shown in FIGS. 21 and 22, the valve V of the vent pipe 36 is closed and, at the same time, the second raw material discharging valve 76 and the valve 79 are opened. In addition, the valve V of the first raw material discharging pipe 61 between the drain pipes 64 and the valve V of the drain pipe 64 in the side of the third liquid removal mechanism 50c are closed. Then, as shown in FIG. 23, in the third liquid removal mechanism 50c, when the first fluid discharging valve 80 and the drainage suction valve 81 are opened and the second fluid discharging valve 82 is closed, the interiors of the second liquid removal mechanism 50b and the vaporizer 11 are vacuumized through the interior of the second raw material discharging pipe 62 extending from the second liquid removal mechanism 50b to the third liquid removal mechanism 50c. Thus, as shown in FIG. 24, the drainage suction valve 81 is closed and, at the same time, a valve (not shown) provided in the side of the first raw material discharging pipe 61 of the pressure detector 66 is opened to read an output value of the pressure detector 66. At this time, if the output value increases (i.e., a degree of vacuum becomes lower) with the lapse of time, then it means that a cleaning solution is left in the vaporizer 11, for example, and, if the output value remains stabilized without increasing, then it means that the removal of liquid from the vaporizer 11 is completed (Step S2). Since no liquid raw material and cleaning solution is left in the vaporizer 11 and in the vicinity thereof by the above-described process, for example even if the vaporizer 11 is removed after the valve (hand valve) V in the side of the second liquid removal mechanism 50b other than the flow rate regulator 41a in the liquid supplying pipe 41 is closed, the reaction tube 12 and the second liquid removal mechanism 50b remains airtight, thereby preventing the liquid raw material and the cleaning solution from being leaked out.

<Removal of Liquid from Raw Material Supplying Pipe>

Figure 25:
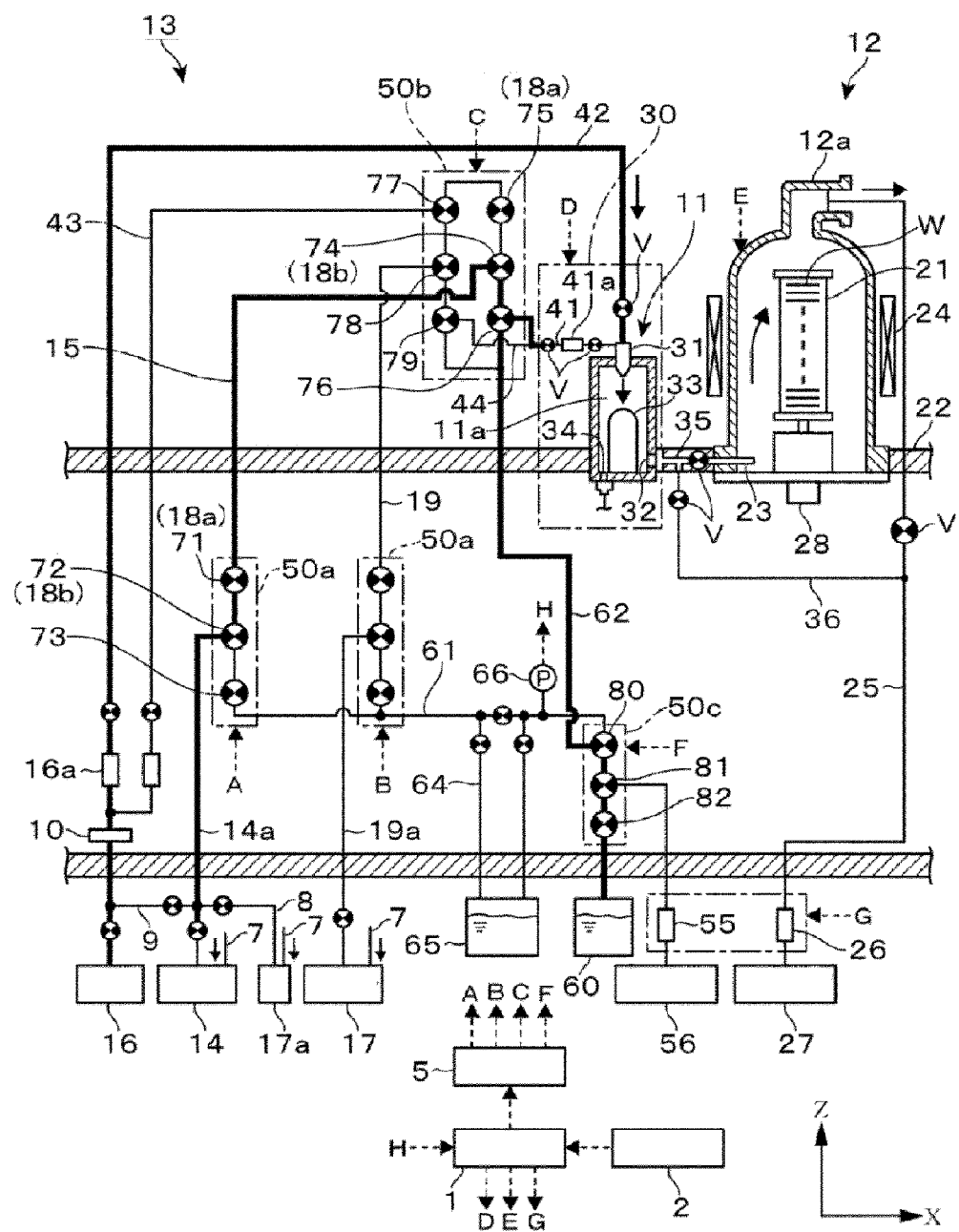
FIG. 25 is a schematic view showing an operation of the raw material supplying device.
Figure 26:
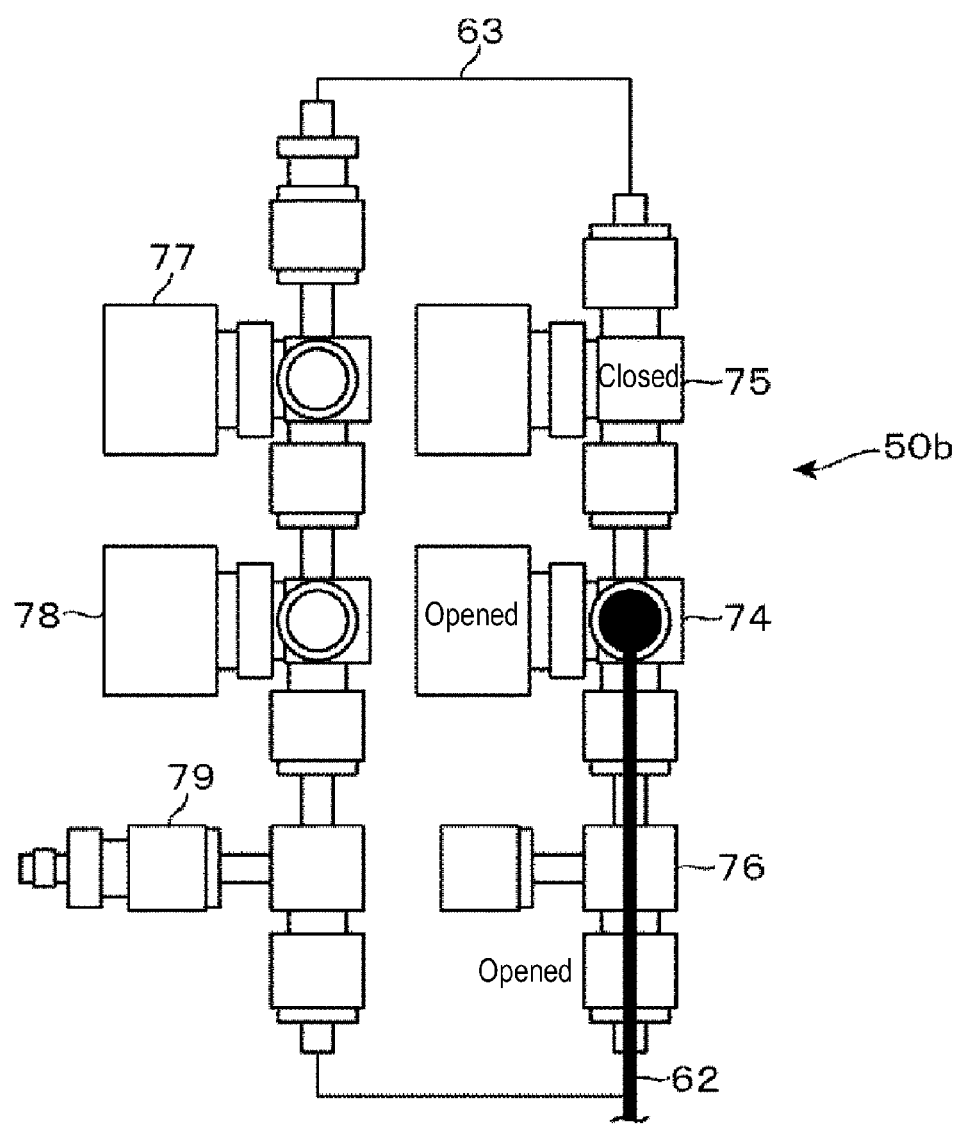
FIG. 26 is a schematic view showing an operation of the raw material supplying device.
Figure 27:
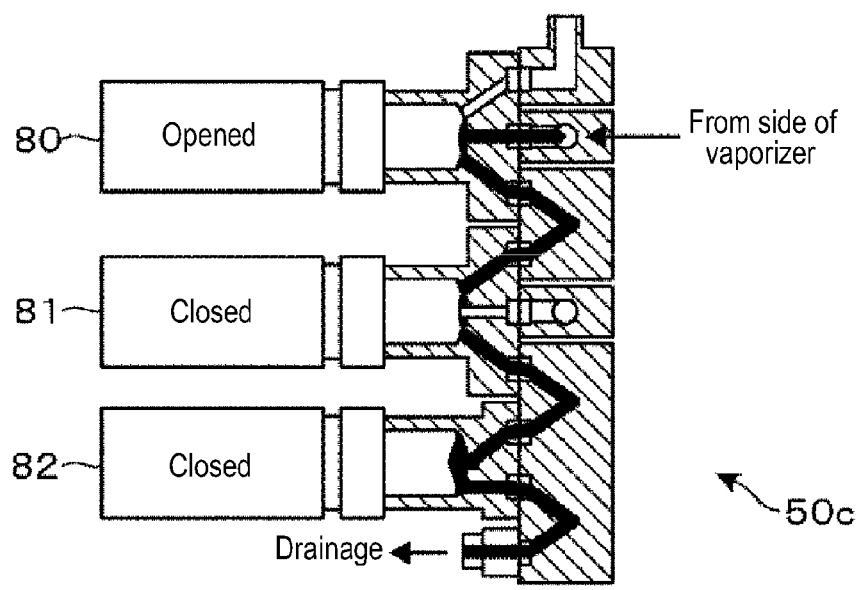
FIG. 27 is a schematic view showing an operation of the raw material supplying device.

Since any liquid raw material is still left in the raw material supplying pipe 15 as shown in FIG. 25, the liquid raw material is removed from the raw material supplying pipe 15 as follows. First, the valve V of the supplying pipe 14a is closed and, subsequently, as shown in FIG. 26, the second raw material discharging valve 76 in the second liquid removal mechanism 50b is opened. In addition, as shown in FIG. 27, in the third liquid removal mechanism 50c, the first fluid discharging valve 80 and the second fluid discharging valve 82 are opened and, at the same time, the drainage suction valve 81 is set to a closed state.

Figure 28:
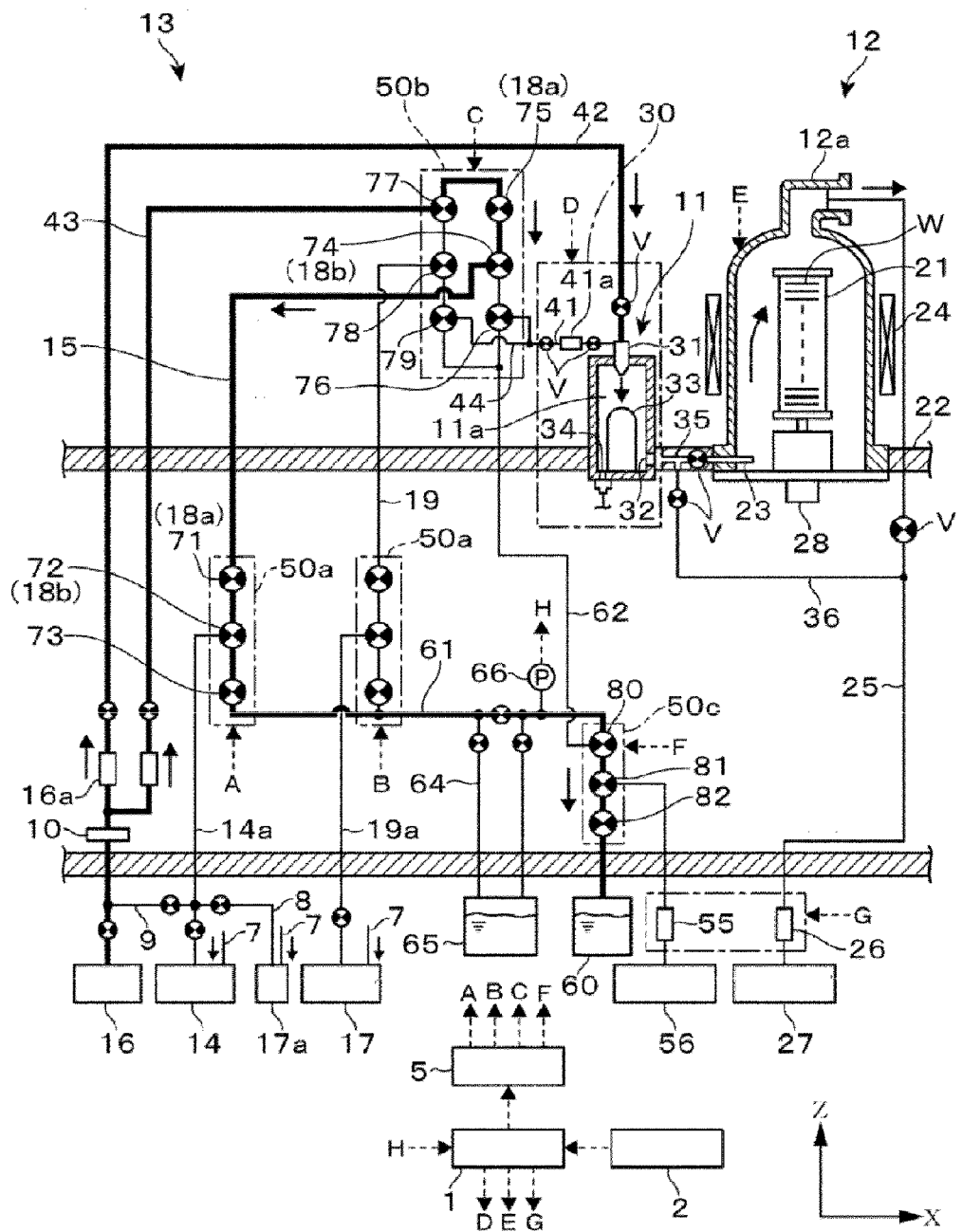
FIG. 28 is a schematic view showing an operation of the raw material supplying device.
Figure 29:
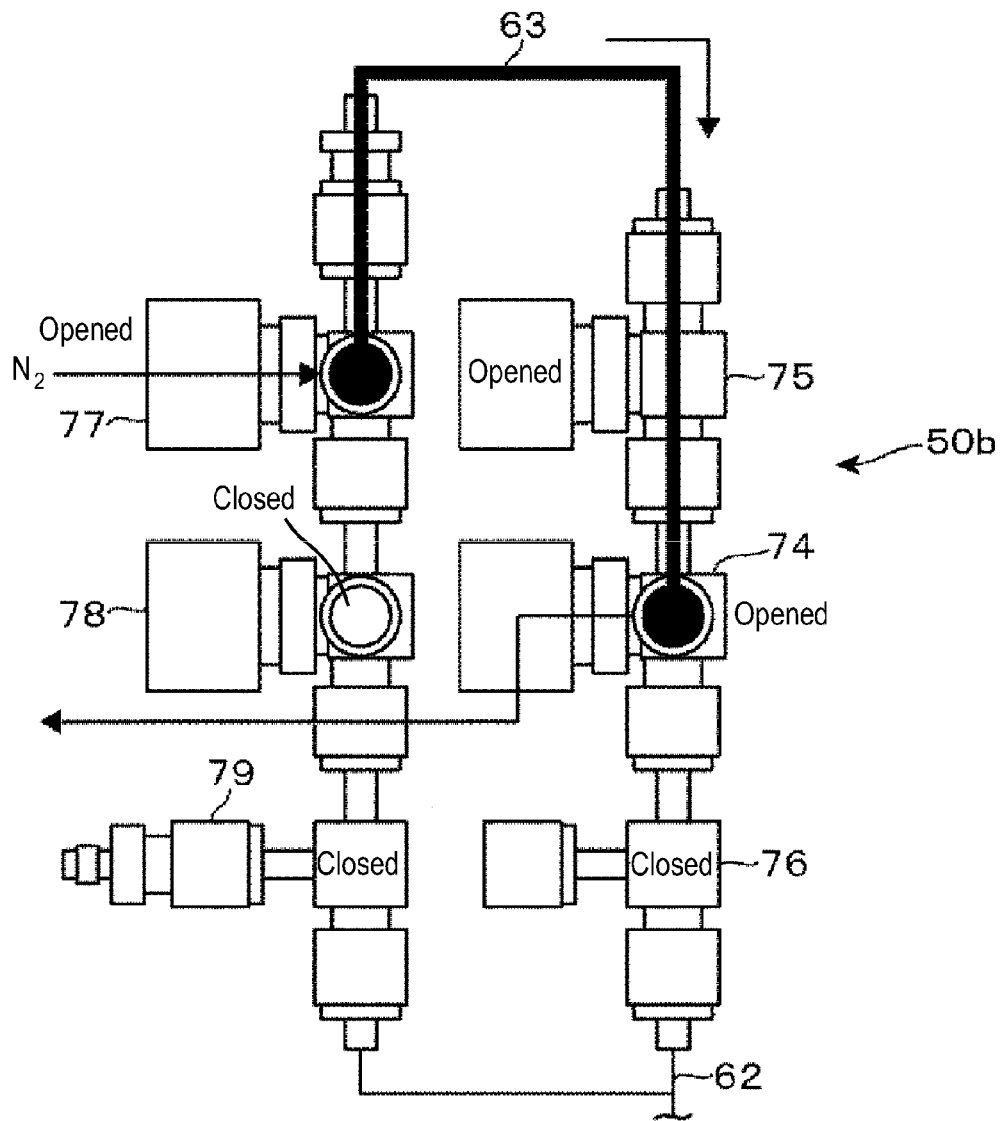
FIG. 29 is a schematic view showing an operation of the raw material supplying device.

Subsequently, as shown in FIGS. 28 and 29, while the purifying gas is supplied from the gas supplying pipe 43 toward the second liquid removal mechanism 50b, the second raw material supplying valve 74, the gas supplying valve 77 and the cleaning fluid supplying valve 75 in the second liquid removal mechanism 50b are opened and the cleaning solution supplying valve 78, the valve 79 and the second raw material discharging valve 76 in the second liquid removal mechanism 50b are closed. Since a passage below the gas supplying valve 77 (the cleaning solution supplying valve 78, the valve 79 and the discharging valve V in the branch pipe 44) is closed, the purifying gas supplied into the gas supplying valve 77 rounds into the upper end of the cleaning fluid supplying valve 75 via the pipe 63 above the gas supplying valve 77 and flows toward the second raw material supplying valve 74 via the cleaning fluid supplying valve 75. In addition, since the second raw material discharging valve 76 and the discharging valve V in the liquid supplying pipe 41 are closed and the second raw material supplying valve 74 is opened, the purifying gas reaching the second raw material supplying valve 74 from above flows through the raw material supplying pipe 15 toward below (the side of the first liquid removal mechanism 50*a*) via the bypass passage 54 of the second raw material supplying valve 74. Accordingly, for example, the liquid material filled in the bypass passage 54 of the second raw material supplying valve 74 and the raw material supplying pipe 15 is returned to below by the purifying gas.

Figure 30:
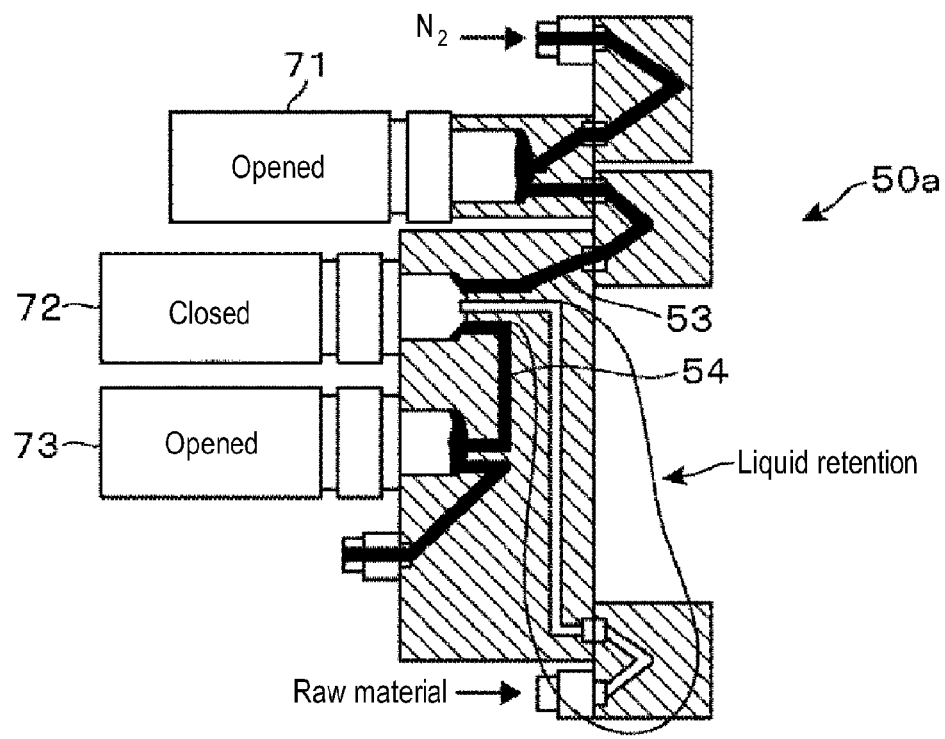
FIG. 30 is a schematic view showing an operation of the raw material supplying device.

In addition, as shown in FIG. 30, in the first liquid removal mechanism 50*a*, when the valve 71 and the first raw material discharging valve 73 are opened and, at the same time, the first raw material supplying valve 72 is closed, the liquid material falling from the raw material supplying pipe 15 as described above is discharged to the first raw material discharging pipe 61 in the lower part via the passages 53 of these valves 71 to 73 by a pressure of the purifying gas. Here, since the first raw material supplying valve 72 is closed, the liquid material stays in the bypass passage 54 of the first raw material supplying valve 72, thereby forming liquid retention.

Figure 31:
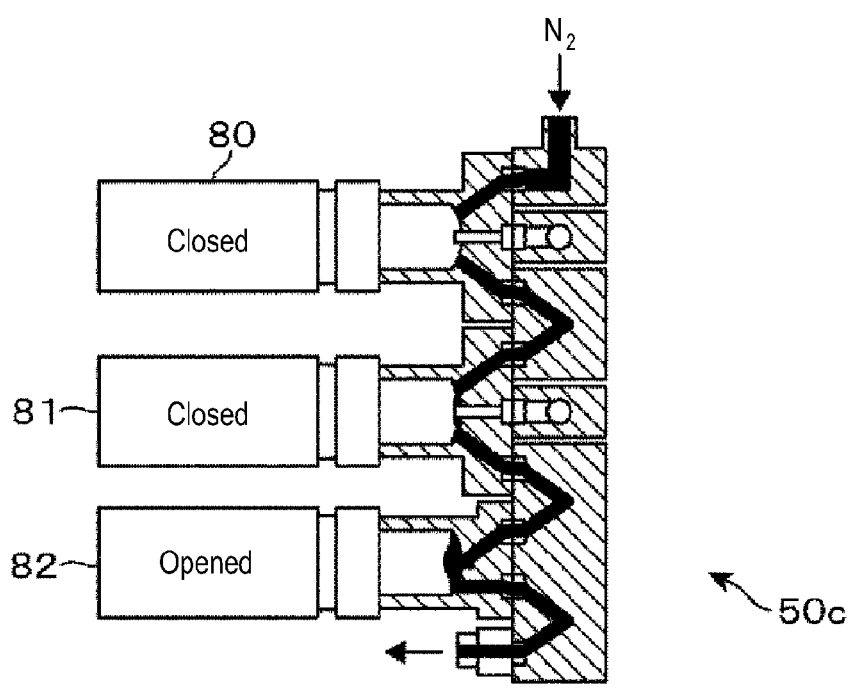
FIG. 31 is a schematic view showing an operation of the raw material supplying device.

In the third removal mechanism 50*c*, since the second fluid discharging valve 82 is opened and the first fluid discharging valve 80 and the drainage suction valve 81 are closed as described above, the liquid material pumped from the first liquid removal mechanism 50*a* into the first raw material discharging pipe 61 is discharged to the drainage 60 (see FIG. 28) via the passages 53 of these valves 80 to 82, as shown in FIG. 31. Thus, the liquid material is quickly removed out of the raw material supplying pipe 15 between the second liquid removal mechanism 50*b* and the first liquid removal mechanism 50*a* from above to below without going against a force of gravity.

Figure 32:
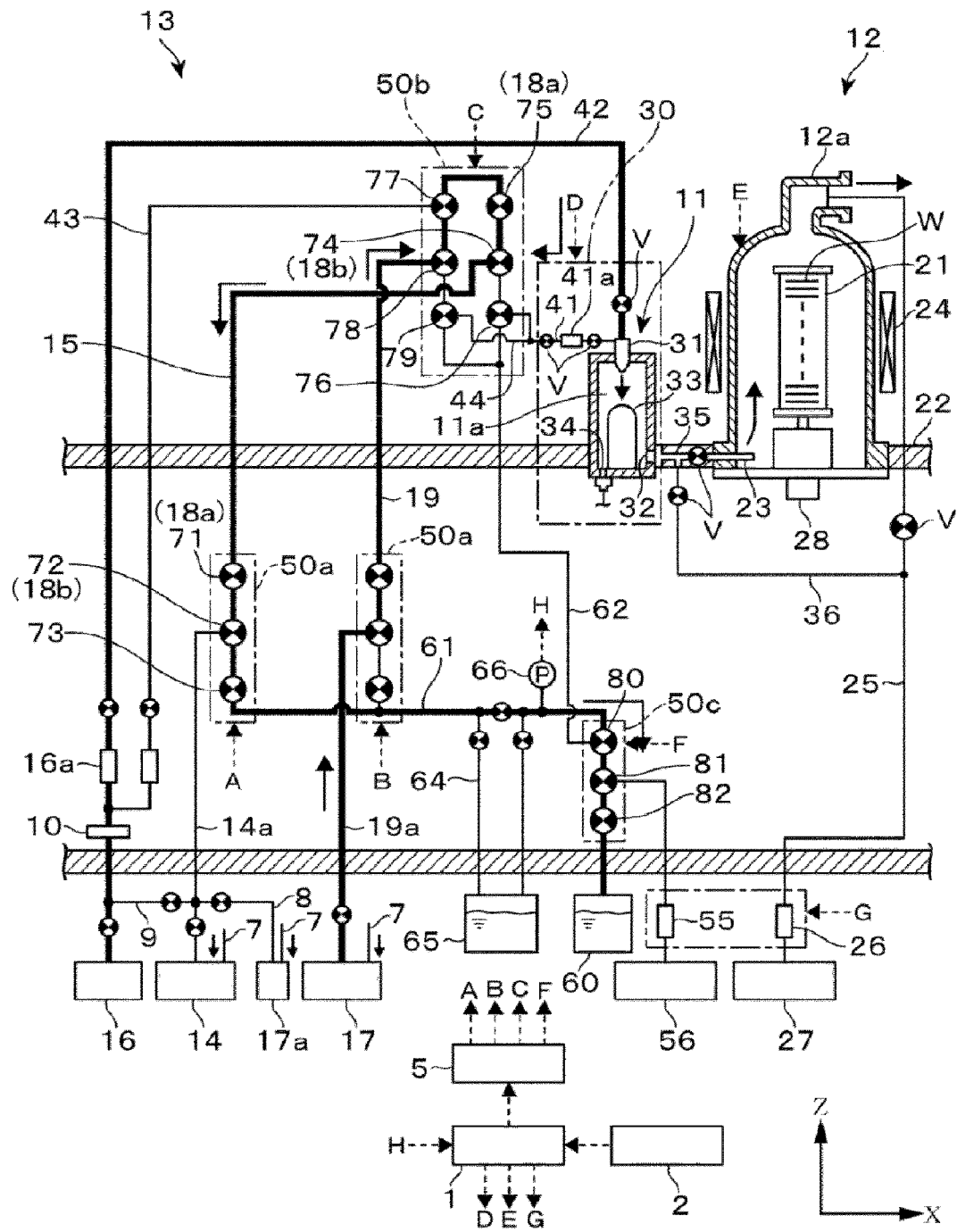
FIG. 32 is a schematic view showing an operation of the raw material supplying device.
Figure 33:
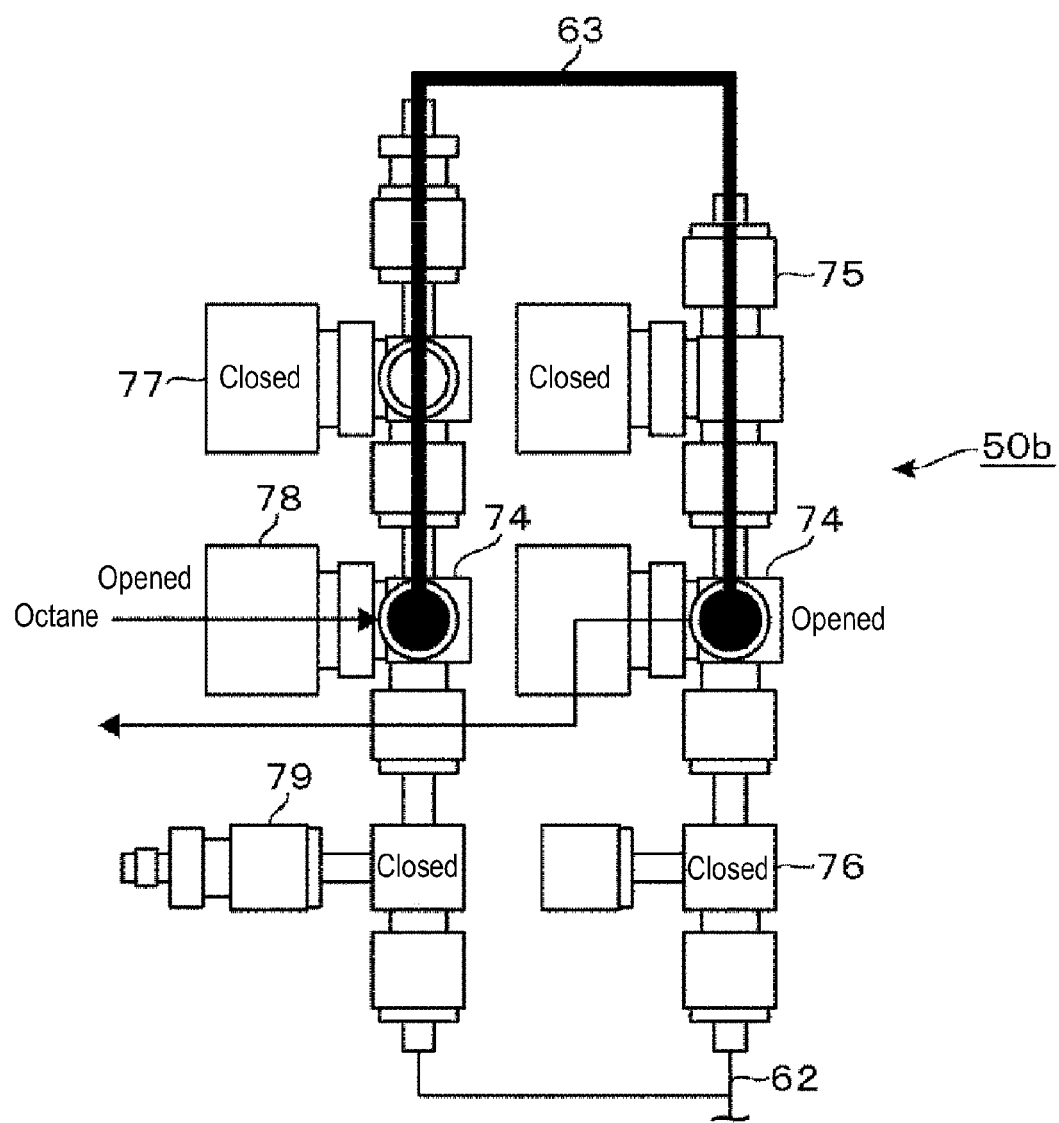
FIG. 33 is a schematic view showing an operation of the raw material supplying device.

Subsequently, as shown in FIG. 32, the cleaning solution is supplied from the cleaning solution repository 17 into the second liquid removal mechanism 50*b* via the first liquid removal mechanism 50*a*. That is, in the first liquid removal mechanism 50*a*, an opened/closed state of the valves 71 to 73 is set like FIG. 12. In addition, as shown in FIG. 33, in the second liquid removal mechanism 50*b*, the cleaning solution valve 78 is opened while the gas supplying valve 77 is closed. The cleaning solution rounds from the cleaning solution supplying valve 78 into the gas supplying valve 77 and the cleaning fluid supplying valve 75 in the upper part and reaches the second raw material supplying valve 74. Then, the cleaning solution is discharged to the drainage 60 via the raw material supplying pipe 15 along a pass shown in FIGS. 30 and 31 described above. Accordingly, even if any liquid material is adhered to the inner wall of the raw material supplying pipe 15 and so on, the inner wall is cleaned by the cleaning solution.

Figure 34:
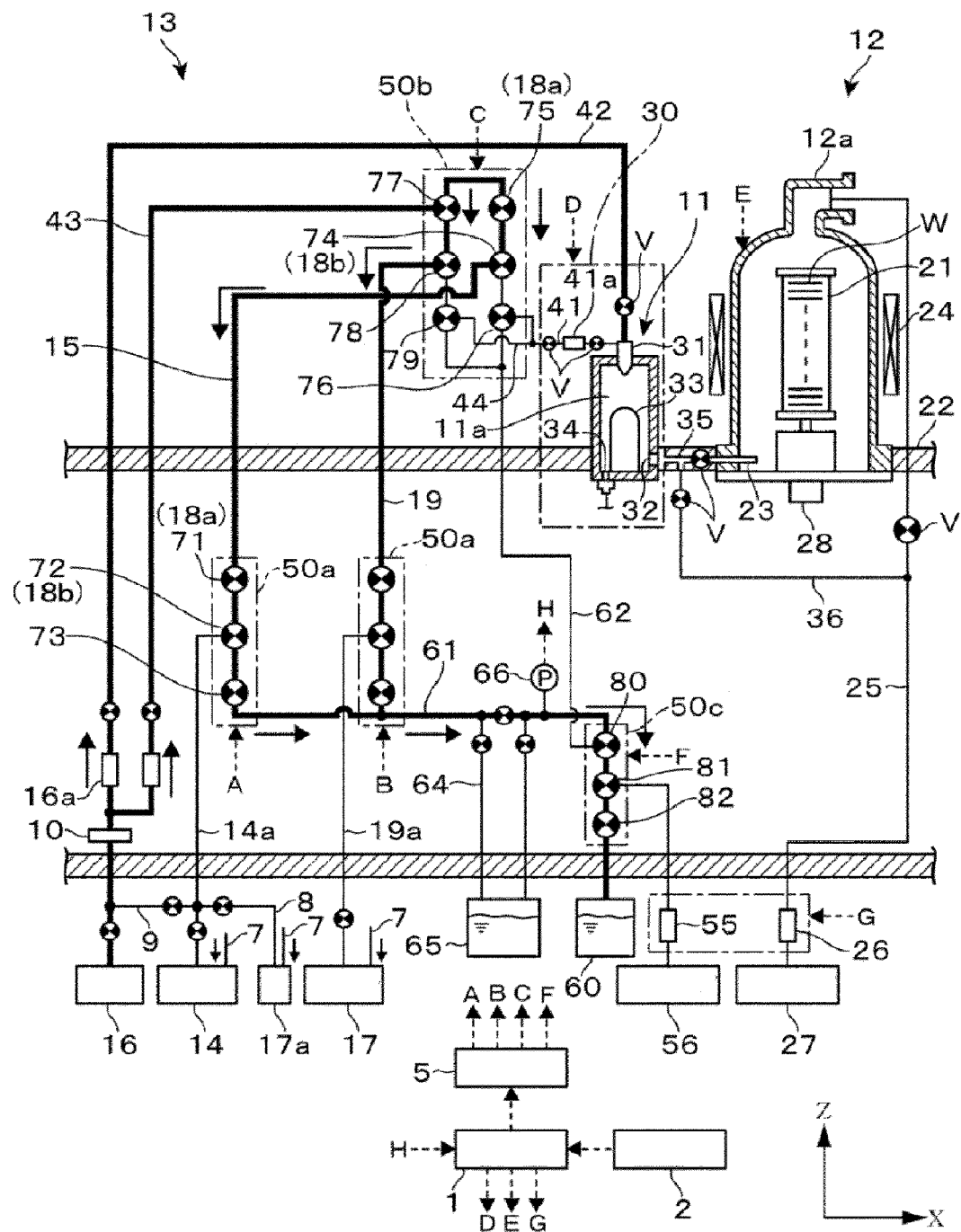
FIG. 34 is a schematic view showing an operation of the raw material supplying device.
Figure 35:
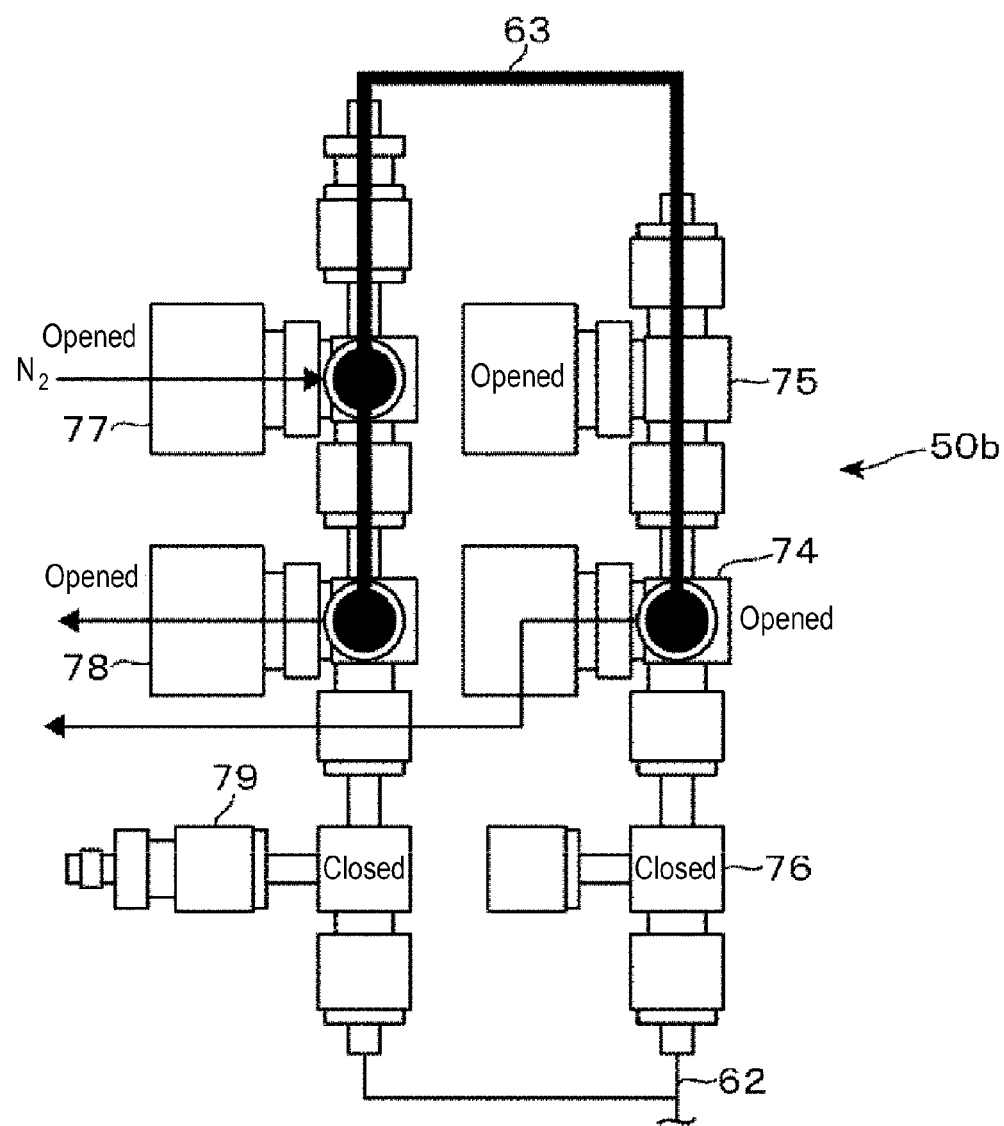
FIG. 35 is a schematic view showing an operation of the raw material supplying device.
Figure 36:
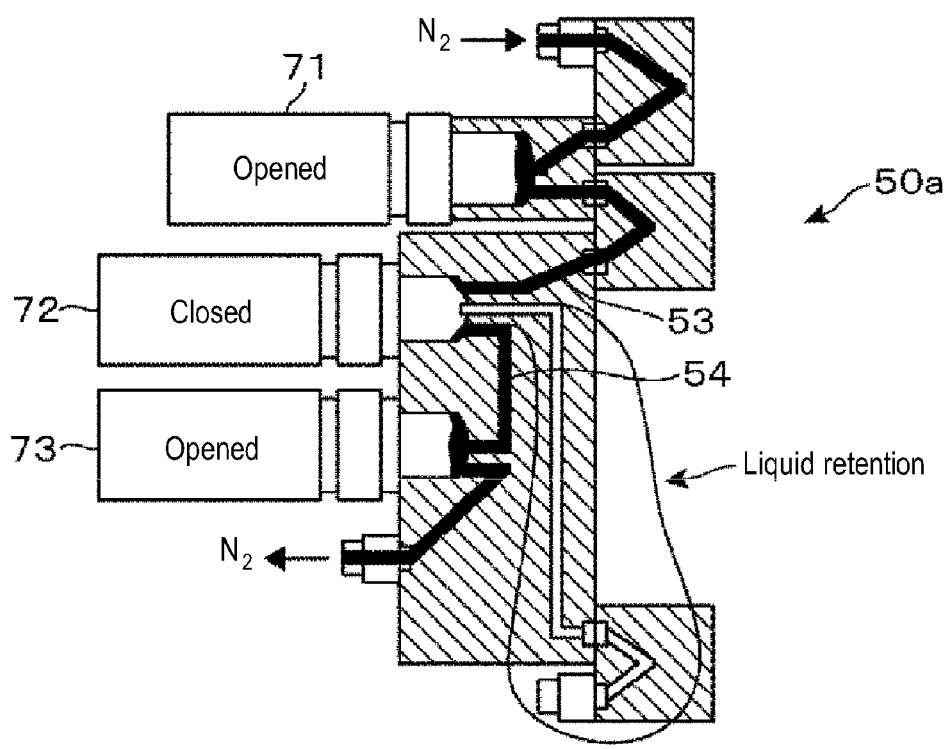
FIG. 36 is a schematic view showing an operation of the raw material supplying device.

Subsequently, as shown in FIG. 34, the cleaning solution is discharged out of the first liquid removal mechanism 50*a* and the second liquid removal mechanism 50*b*. That is, after the supply of the cleaning solution is stopped (i.e., the valve V of the supplying pipe 19*a* is closed), the gas supplying valve 77 in the second liquid removal mechanism 50*b* is opened to supply the purifying gas into the second liquid removal mechanism 50*b*. Since the purifying gas flows through the raw material supplying pipe 15 and the cleaning supplying pipe 19 toward below as shown in FIG. 35, the cleaning solution in the raw material supplying pipe 15 and the cleaning supplying pipe 19 is discharged to the drainage 60. Here, as shown in FIG. 36, in the first liquid removal mechanism 50*a* of the raw material supplying pipe 15, since the first raw material supplying valve 72 keeps closed, any liquid material remains left in the bypass passage 54 of the first raw material supplying valve 72.

As an alternative, one of the second raw material supplying valve 74 and the cleaning solution supplying valve 78 may be first opened and, subsequently, while the one valve is closed, the other valve may be opened to supply the purifying gas into the raw material supplying pipe 15 and the cleaning supplying pipe 19 in order. In addition, if the liquid material is only removed out of the apparatus (i. e, the cleaning solution is left in the apparatus), the liquid material may not be removed out of the cleaning solution supplying pipe 19. Accordingly, if the cleaning solution remains left in the cleaning solution supplying pipe 19, the cleaning solution supplying pipe 19 remains filled with the cleaning solution without the interior of the cleaning solution supplying pipe 19 being vacuumized in the subsequent processes.

Figure 37:
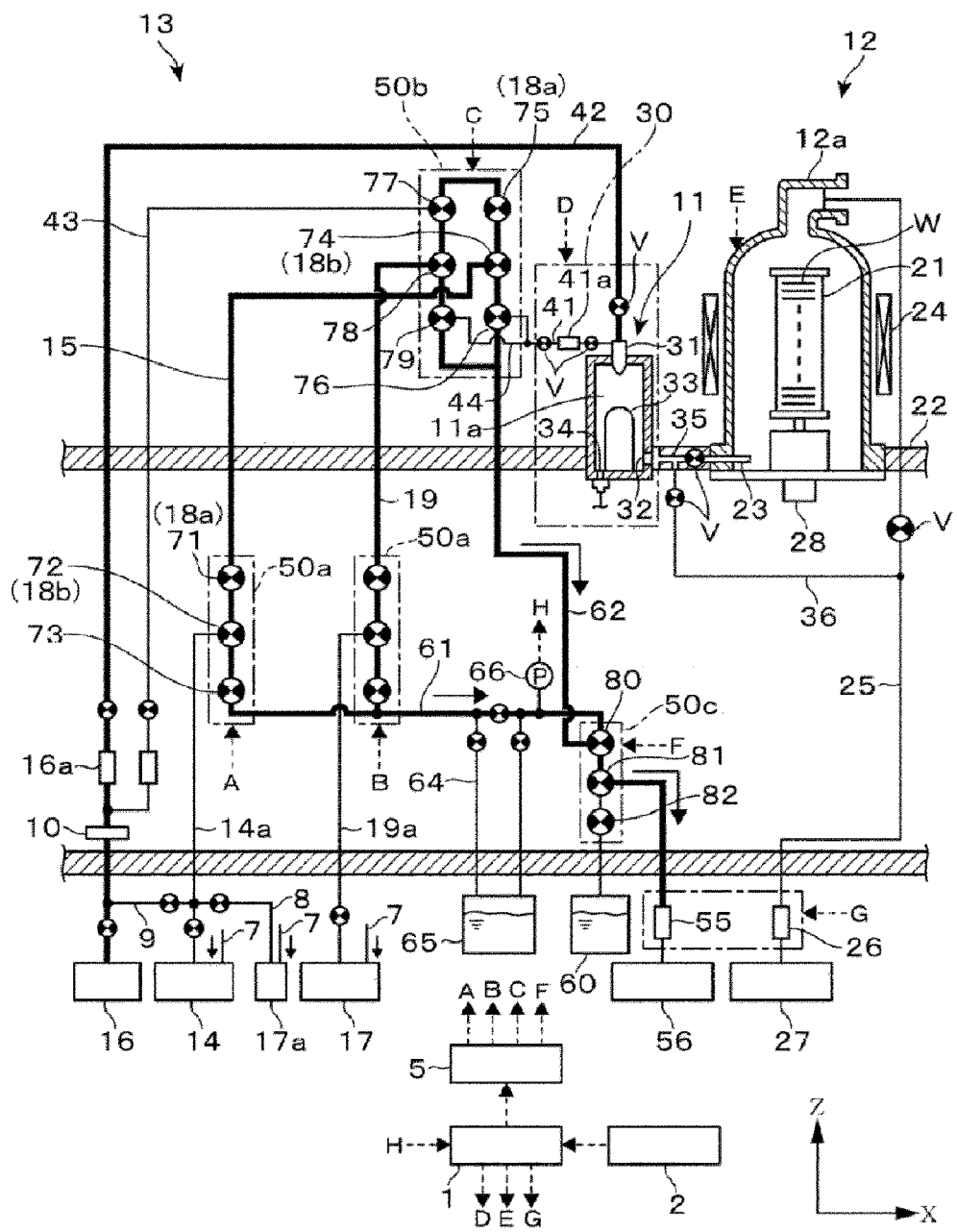
FIG. 37 is a schematic view showing an operation of the raw material supplying device.
Figure 38:
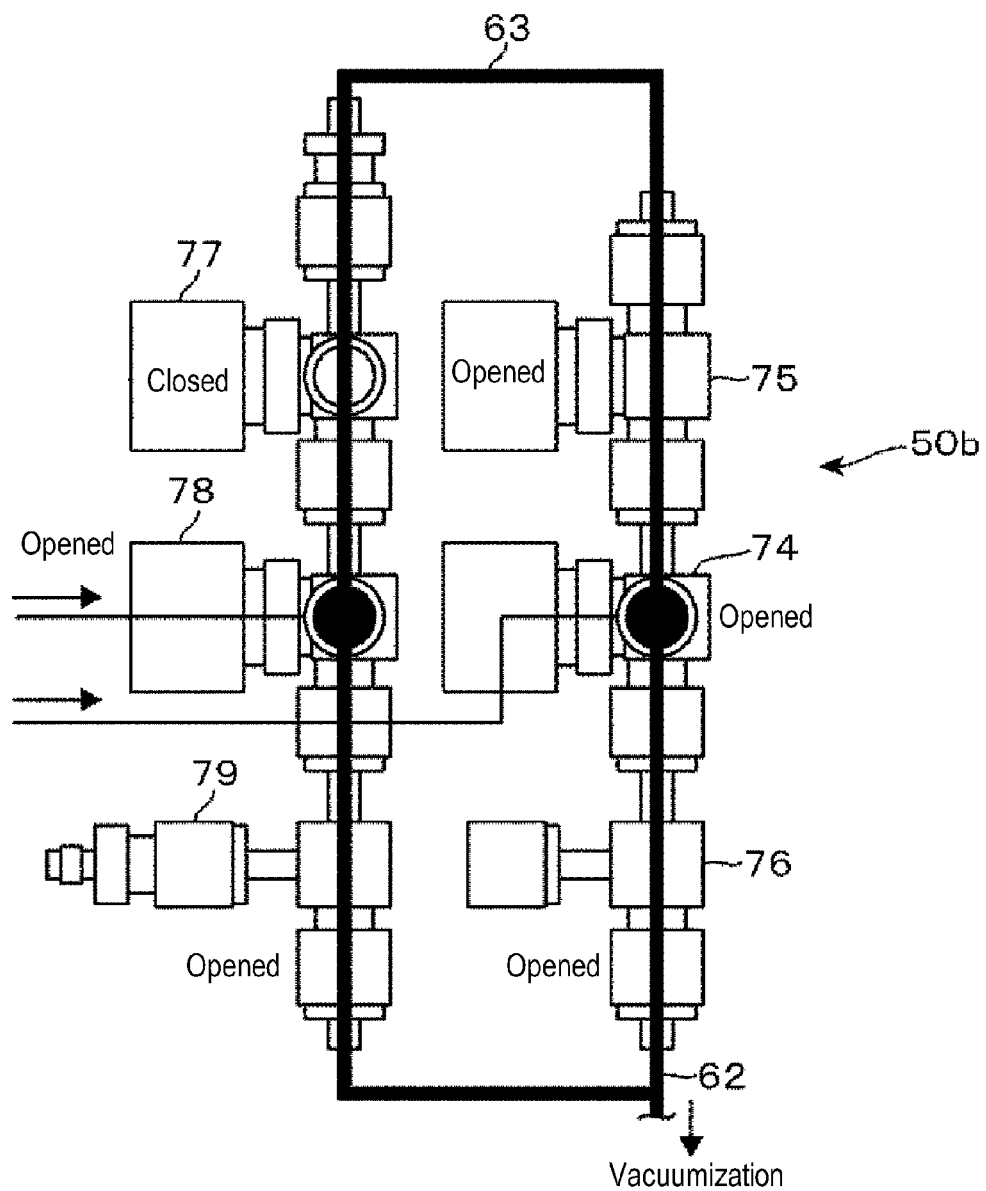
FIG. 38 is a schematic view showing an operation of the raw material supplying device.
Figure 39:
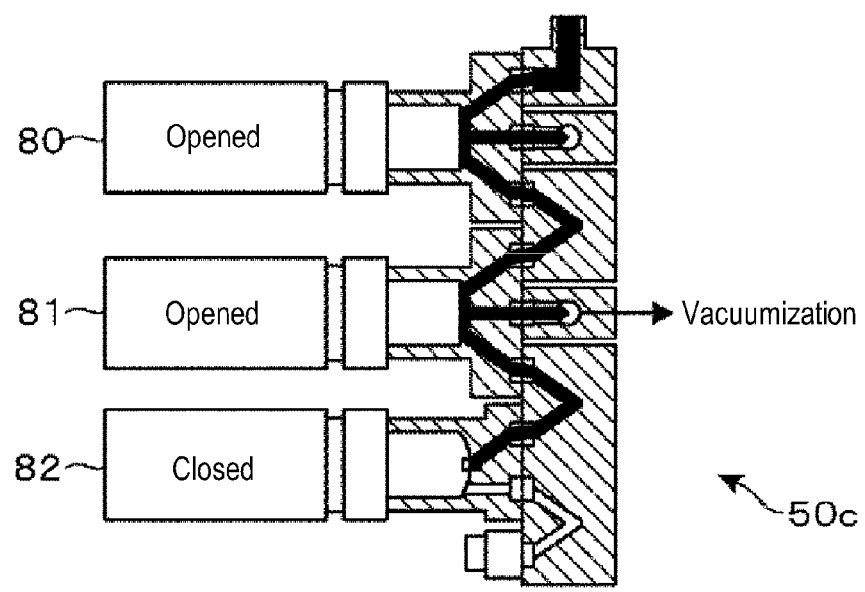
FIG. 39 is a schematic view showing an operation of the raw material supplying device.

Thereafter, as shown in FIG. 37, the interior of each of the liquid removal mechanisms 50 is vacuumized Specifically, as shown in FIG. 38, in the second liquid removal mechanism 50*b*, the valves 74, 75, 76, 78 and 79 are opened and the gas supplying valve 77 is closed. In addition, as shown in FIG. 39, in the third liquid removal mechanism 50*c*, the valves 80 and 81 are opened and the second fluid discharging valve 82 is closed. Accordingly, for example, even if some cleaning solution is left in the interiors of the raw material supplying pipe 15, the cleaning solution supplying pipe 19 and the raw material discharging pipes 61 and 62, the interiors become vacuumized by the vacuum pump 56 connected to the bypass passage 54 of the drainage suction valve 81 through the first liquid removal mechanism 50*a* and the second liquid removal mechanism 50*b*, thereby volatilizing the cleaning solution. It is detected by the pressure detector 66 whether or not the cleaning solution from the raw material supplying pipe 15, the cleaning solution supplying pipe 19 and the raw material discharging pipes 61 and 62 is removed (volatilized). That is, a valve (not shown) of the pressure detector 66 provided in the side of the first raw material discharging pipe 61 is opened and an output value of the pressure detector 66 is read. Then, for example, if the drainage suction valve 81 is closed and the output value increases (i.e., a degree of vacuum becomes lower) with the lapse of time, then it means that any cleaning solution is left in the raw material supplying pipe 15, for example, and, if the output value remains stabilized without increasing, then it means that the cleaning solution is discharged. Thus, the removal of liquid from the raw material supplying pipe 15, the cleaning solution supplying pipe 19 and the raw material discharging pipes 61 and 62 between the first liquid removal mechanism 50*a*, the second liquid removal mechanism 50*b* and the third liquid removal mechanism 50*c* is completed to clean the interiors thereof (Step S3).

<Removal of Liquid from Raw Material Repository>

Figure 40:
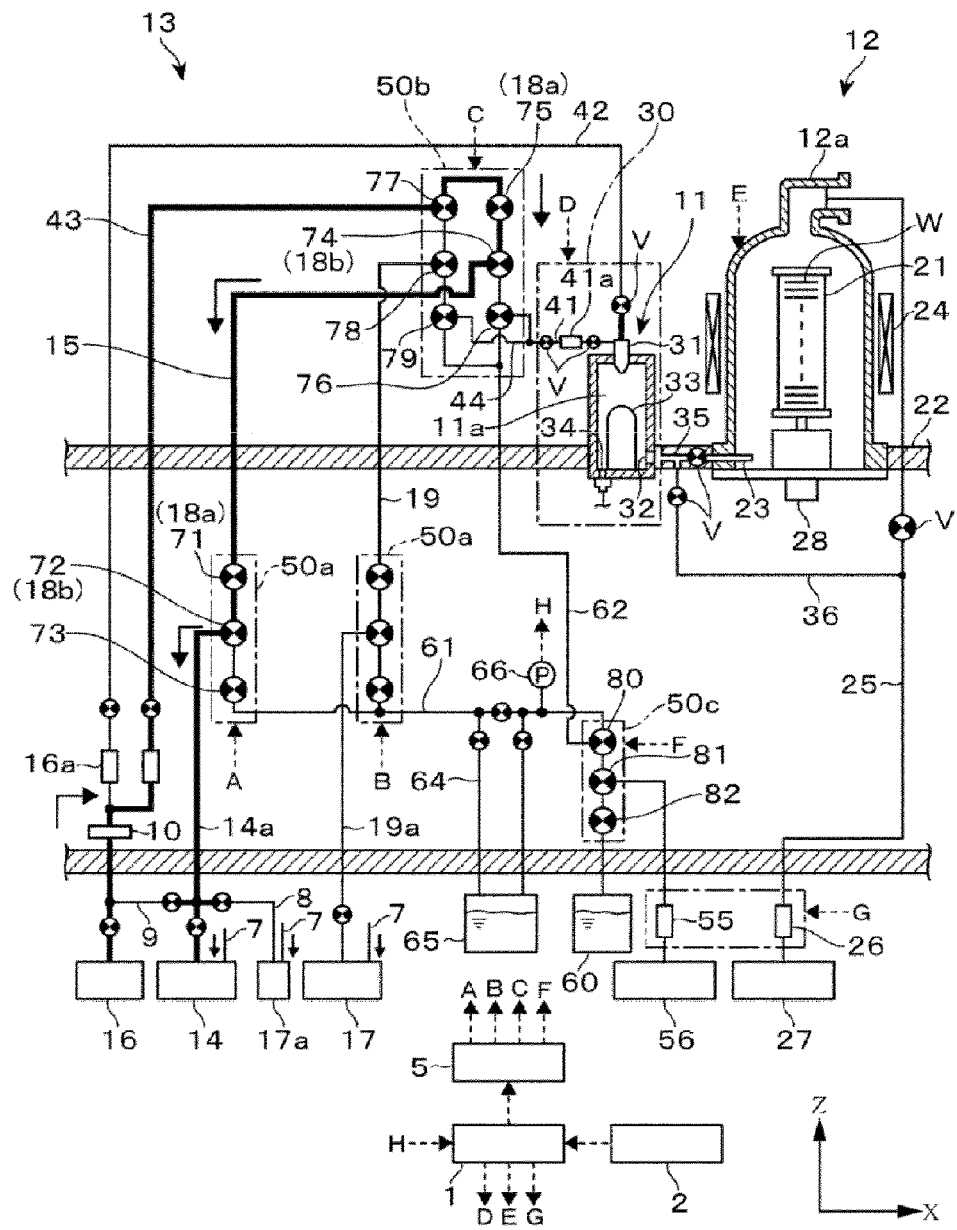
FIG. 40 is a schematic view showing an operation of the raw material supplying device.
Figure 41:
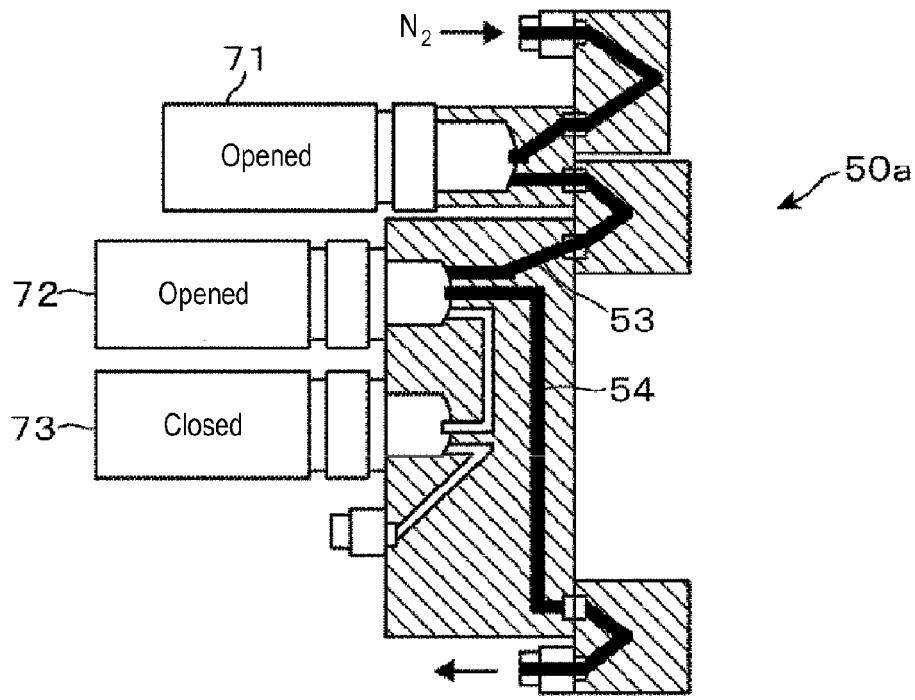
FIG. 41 is a schematic view showing an operation of the raw material supplying device.

Next, removal of liquid from the supplying pipe 14*a* in the side of the raw material repository 14 other than the first liquid removal mechanism 50*a* and cleaning of the supplying pipe 14*a* are performed (Step S4). That is, as shown in FIGS. 40 and 41, the valve 73 in the first removal mechanism 50*a* is closed and the first raw material supplying valve 72 is opened. In addition, an opened/closed state of the valves (74 to 79) is set like FIG. 29. When the valve V of the supplying pipe 14*a* in the side of the raw material repository 14 is opened, the liquid material left in the bypass passage 54 of the first raw material supplying valve 72 is returned to the raw material repository 14 by a pressure of the purifying gas.

Figure 42:
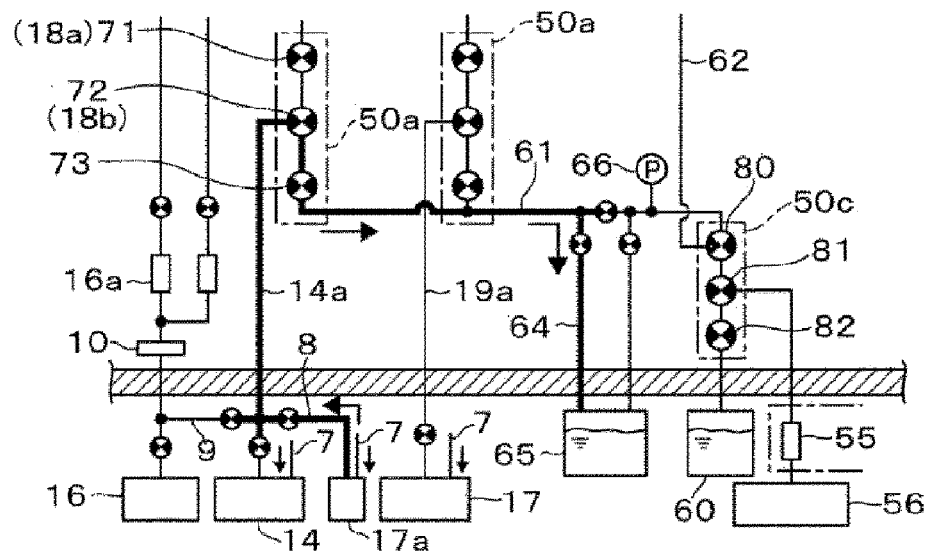
FIG. 42 is a schematic view showing an operation of the raw material supplying device.
Figure 43:
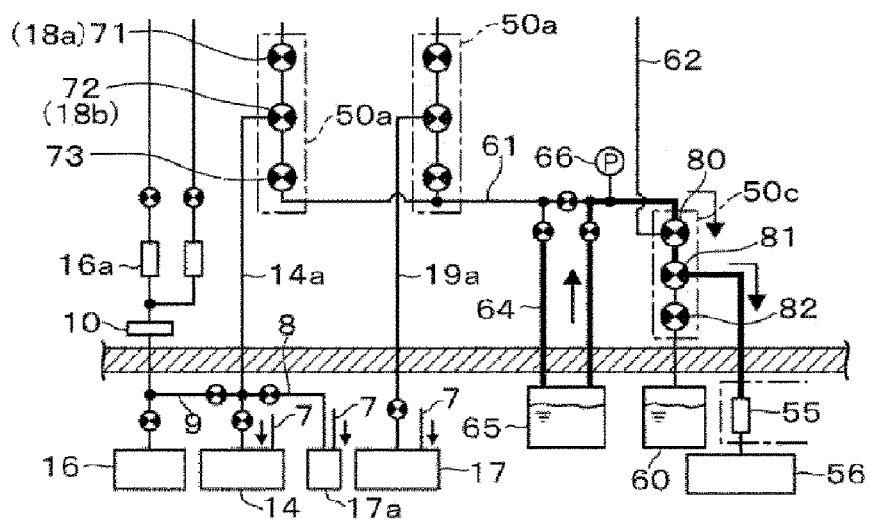
FIG. 43 is a schematic view showing an operation of the raw material supplying device.
Figure 44:
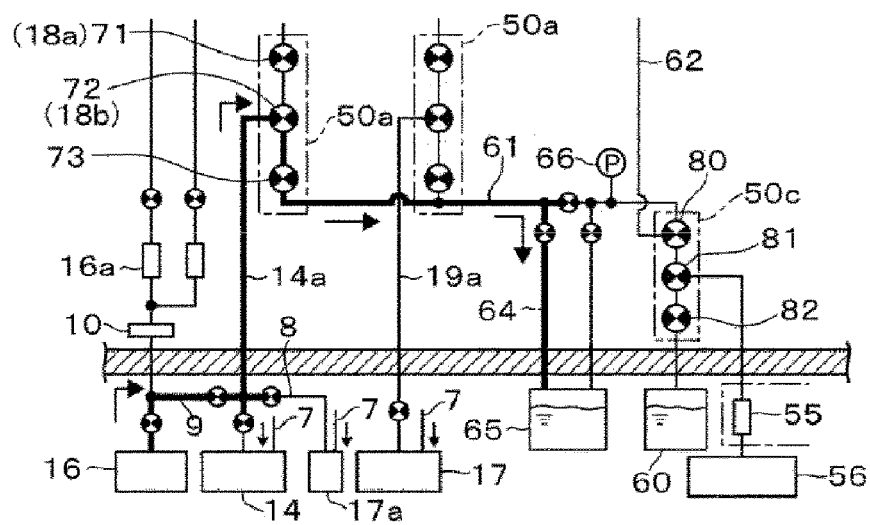
FIG. 44 is a schematic view showing an operation of the raw material supplying device.
Figure 45:
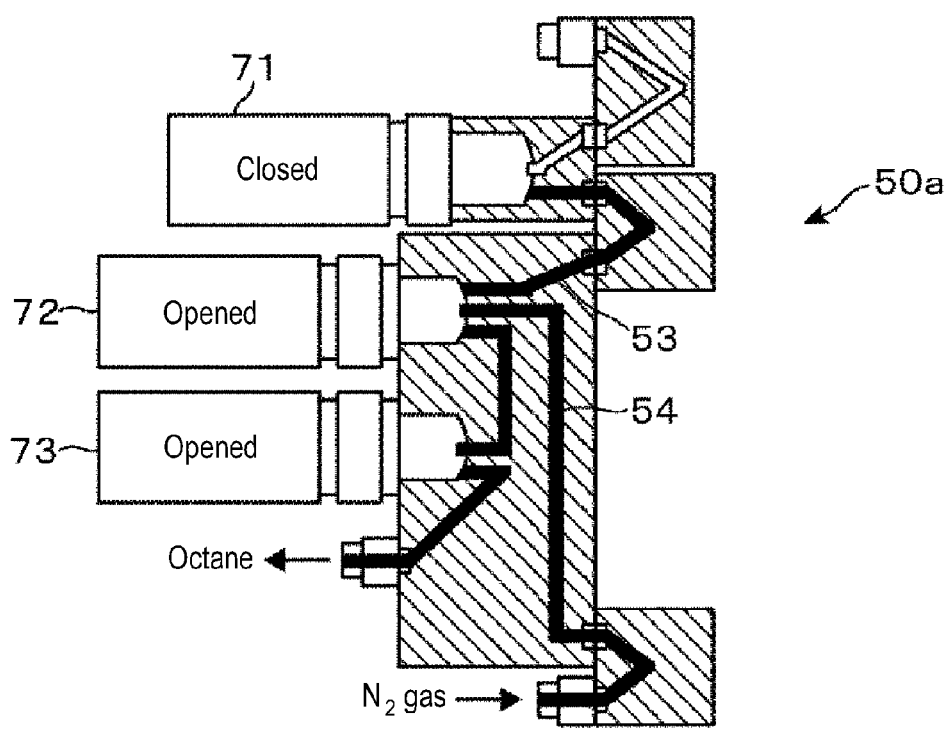
FIG. 45 is a schematic view showing an operation of the raw material supplying device.
Figure 46:
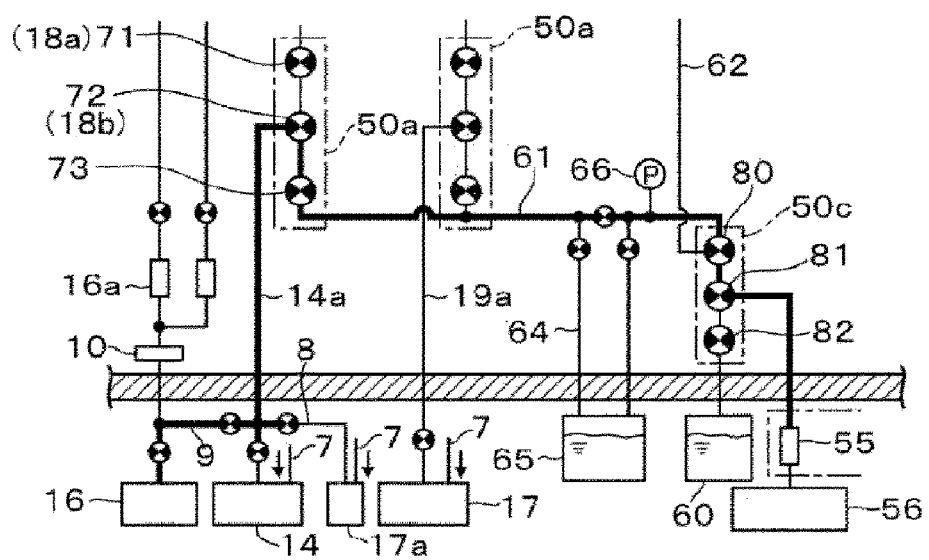
FIG. 46 is a schematic view showing an operation of the raw material supplying device.
Figure 47:
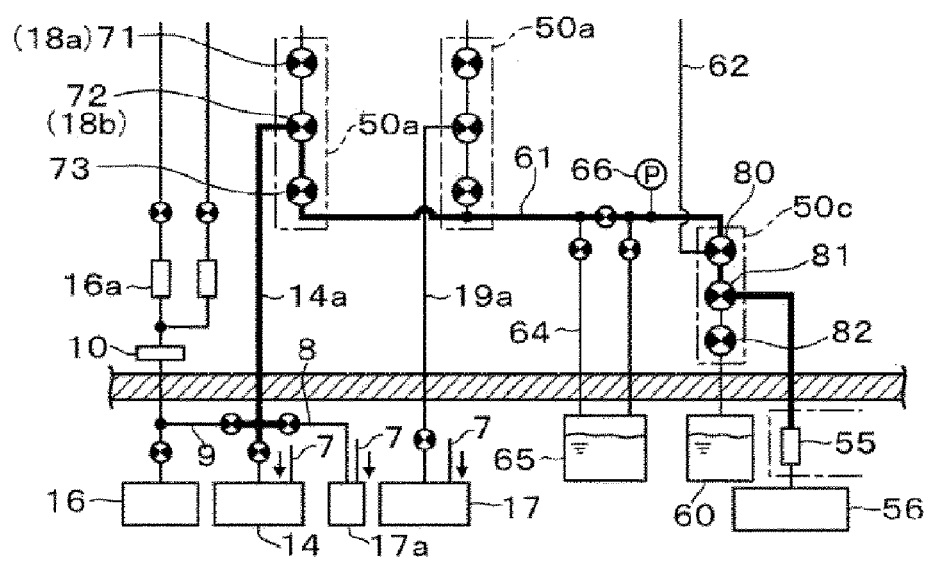
FIG. 47 is a schematic view showing an operation of the raw material supplying device.

Then, the valve V is closed after the liquid material is returned to the raw material repository 14 other than the valve V of the supplying pipe 14*a*. In addition, in the first liquid removal mechanism 50a, the valve 71 is closed and the first raw material discharging valve 73 is opened. Subsequently, as shown in FIG. 42, the valve V of the drain pipe 64 in the side of the first liquid removal mechanism 50a is opened to supply the cleaning solution from the auxiliary repository 17a into the drain tank 65 via the supplying pipe 14a, the first raw material discharging pipe 61 and the drain pipes 64. The interior of the bypass passage 54 of the first raw material supplying valve 72 is cleaned by this cleaning solution. Then, as shown in FIG. 43, one V of the two valves V of the drain pipes 64 in the vacuum pump 56 is opened and the other valve V (in the side of the first liquid removal mechanism 50a) is closed. In addition, the valve V disposed on the first raw material discharging pipe 61 between the drain pipes 64 is closed. Thus, after a region above the level of liquid in the drain tank 65 is made vacuous through the vacuum pump 56, as shown in FIG. 44, the valves V are switched like FIG. 42 to supply the purifying gas from the gas repository 16 into the drain tank 65 via the supplying pipe 14a, the first raw material discharging pipe 61 and the drain pipes 64. As shown in FIG. 45, for example, the cleaning solution in the bypass passage 54 of the first raw material supplying valve 72 is discharged by this purifying gas. Thereafter, the valves V of the drain pipes 64 are closed and the valve V of the first raw material discharging pipe 61 is opened. Then, when the supply of the purifying gas into the supplying pipe 14a, the first liquid removal mechanism 50a and the first raw material discharging pipe 61 shown in FIG. 46 and the vacuumization of the supplying pipe 14a, the first liquid removal mechanism 50a and the first raw material discharging pipe 61 shown in FIG. 47 are repeated several times, the interior of the supplying pipe 14a is cleaned. Even in this case, whether or not the removal of liquid from the first raw material discharging pipe 61 has been completed is determined based on the output value of the pressure detector 66.

Figure 48:
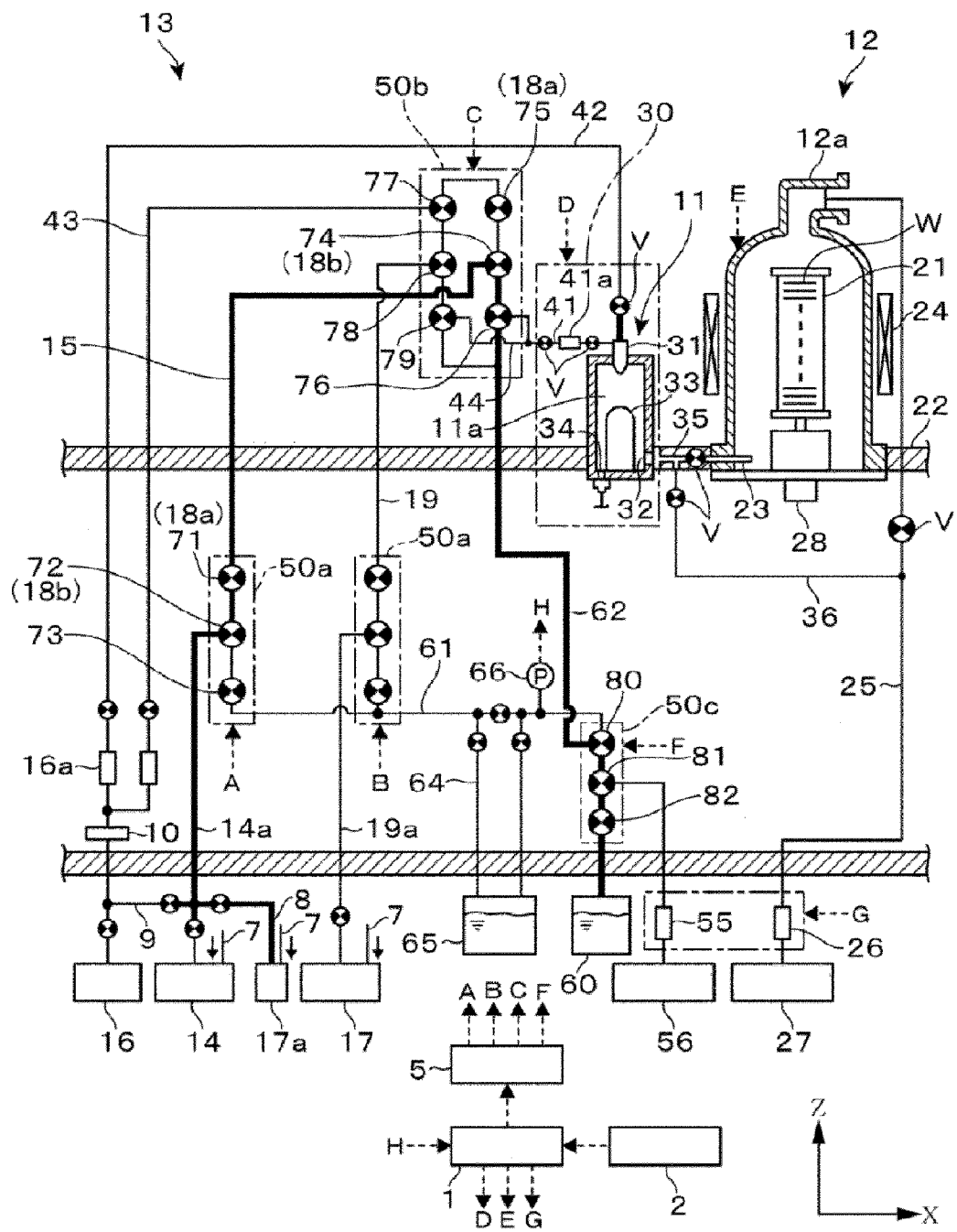
FIG. 48 is a schematic view showing an operation of the raw material supplying device.

Thereafter, as shown in FIG. 48, the process of supplying the cleaning solution from the auxiliary repository 17a into the second liquid removal mechanism 50b via the supplying pipe 14a and the raw material supplying pipe 15 and discharging the cleaning solution from the second raw material discharging pipe 62 and the process of vacuumizing the interiors of the supplying pipe 14a, the raw material supplying pipe 15 and the second raw material discharging pipe 62 are repeated several times, thereby completing a series of liquid removal processes as described above. Thereafter, the raw material supplying pipe 15 and the vaporizer 11 are removed from the apparatus and the vaporizer 11 and so on may be maintained or the raw material repository 14 and the vaporizer 11 may be replaced with new ones for supplying new or different liquid material. In addition, in the second liquid removal mechanism 50b, if any liquid material or cleaning solution is left in the side of the discharging valve V other than the valve 79 and the second raw material discharging valve 76, the cleaning solution or the purifying gas is supplied to the side of the discharging valve V to discharge the left liquid material or cleaning solution to the vent pipe 36 via the vaporizer 11.

According to the above-described embodiment, when the liquid material is supplied from the raw material repository 14 into the vaporizer 11 via the raw material supplying pipe 15, the first raw material discharging pipe 61 is placed below the raw material supplying pipe 15 and the purifying gas and the cleaning solution are supplied through the raw material supplying pipe 15 from above to below. Then, the gas supplying valve 77 for supplying the purifying gas is placed above the second raw material supplying valve 74 and the cleaning solution supplying valve 78 for supplying the liquid material and the cleaning solution, respectively. In addition, in each of the liquid removal mechanisms 50a, 50b and 50c, the valves 50 are arranged such that liquid retention is not formed or is minimized. Accordingly, since the liquid material and the cleaning solution are discharged from above to below without going against a force of gravity, even if the liquid material is TEMAZ or the like which is hard to be volatilized due to its specific gravity larger than water, the liquid material can be quickly and easily discharged out of the raw material supplying pipe 15. That is, while conventional methods of supplying purifying gas through the raw material supplying pipe 15 from below to above for liquid removal required a few days for liquid removal and further might provide insufficient cleaning (a low level of cleaning), the present disclosure makes it possible to halve time taken for liquid removal and provide a very high level of cleaning for portions where liquid is removed.

Thus, operation hours (film forming time) of the apparatus can be lengthened (prolonged). In addition, since the liquid material makes little or no contact with the air when the raw material supplying pipe 15 is removed, it is possible to prevent toxic gas such as diethylamine $(C_2H_5)_2NH$), dimethylamine $(CH_3)_2NH$) or the like from being generated. In addition, since it is possible to prevent reaction products from being generated by reaction of liquid material with water contained in the air, it is possible to prevent the raw material supplying pipe 15 from being blocked due to the reaction products. Accordingly, the reaction products can be prevented from being adhered to the valve bodies 52 (see FIG. 4) of the valves, which may result in long life of the valves. In addition, usage of purifying gas can be greatly reduced. In addition, since the valves V are arranged such that only the bypass passage 54 of the first raw material supplying valve 72 corresponds to a portion where the liquid material of the first liquid removal mechanism 50a is left when liquid is removed from the raw material supplying pipe 15, it is possible to easily and quickly achieve removal of liquid from the portion and cleaning of the portion. In addition, in case of the liquid removal in the above-described Step S1 for maintenance of the vaporizer 11, the present disclosure can reduce time taken for liquid removal to several hours although conventional methods required several tens hours for liquid removal.

When the liquid removal mechanisms are installed as described above, since the valves are generally vertically arranged in each of the liquid removal mechanisms and the bypass passage 54 uses the 3-way valve 18b opened below the first raw material discharging valve 73, it is possible to reduce an extending (contacting) region of the liquid material as compared to when the valves are horizontally arranged. This can result in reduction of time required for liquid removal and cleaning and reduction of foot prints of the liquid removal mechanisms to the minimum. In addition, since a space where the pressure detector 66 and the filter 10 are formed can be secured as much as the foot prints of these liquid removal mechanisms are reduced, end point detection of liquid removal and removal of water from purifying gas (prevention of reaction products in the raw material supplying pipe 15) can be achieved. Accordingly, for example, when the vaporizer 11 is removed, there is no leakage of residual liquid (liquid material and cleaning solution) out of the vaporizer 11. In addition, when the liquid material and the cleaning solution are discharged from the first raw material discharging pipe 61 or the second raw material discharging pipe 62, since they are once discharged without the pipes being directly vacuumized by the vacuum pump 56, deterioration (load) of the vacuum pump 56 can be suppressed, which can result in long life of the vacuum pump 56.

In addition, for example, in the second liquid removal mechanism 50b, the liquid material encounters the cleaning solution through two or more valves. For example, the cleaning fluid supplying valve 75 and the gas supplying valve 77 are interposed between the second raw material supplying valve 74 for supplying the liquid material and the cleaning solution supplying valve 78 for supplying the cleaning solution. Accordingly, for example, even if the cleaning solution is a little leaked to the liquid material through the cleaning solution supplying valve 78, reaction of water contained in the cleaning solution with the liquid material can be suppressed to prevent reaction products from being adhered to the interior of the valves.

In addition, since the liquid material in the second liquid removal mechanism 50b is discharged to the third liquid removal mechanism 50c through the second raw material discharging valve 76 provided in the second liquid removal mechanism 50b, fast liquid removal can be achieved as compared to when the liquid material is discharged to the vaporizer 11 through the nozzle 31. In addition, as shown in FIG. 45, when the cleaning solution is discharged from the bypass passage 54 of the first raw material supplying valve 72, since the valve 71 near the upper part of the first raw material supplying valve 72 is closed, leakage of the cleaning solution into the side of the raw material supplying pipe 15 can be suppressed. In addition, for example, while heaters were often wound on the raw material supplying pipe 15 and the cleaning solution pipe 19 in order to volatilize any cleaning solution left in the raw material supplying pipe 15 and the cleaning solution pipe 19 in a conventional valve configuration where the liquid material is discharged from below to above, the present disclosure can save a space without providing such heaters.

Figure 49:
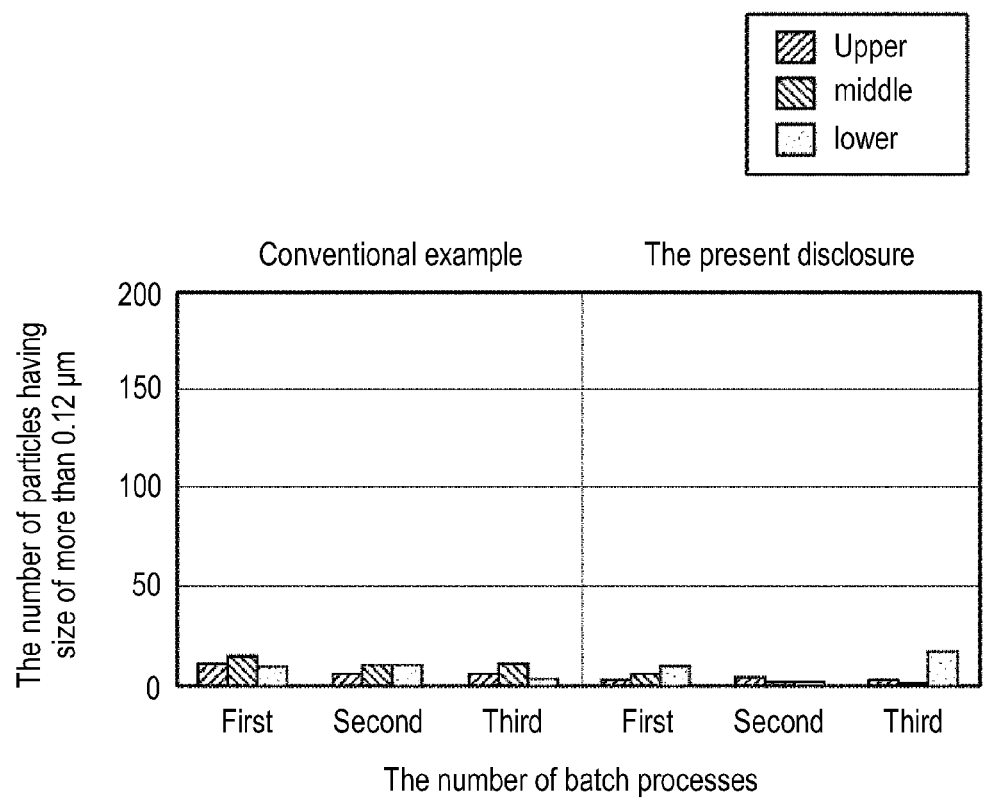
FIG. 49 is a graph showing characteristics of a vertical heat processing apparatus.

FIG. 49 shows a result of measurement on the quantity of particles adhered to upper, middle and wafers S in the reaction tube 12 when liquid material vaporized in the vaporizer 11 is actually used to perform a film forming process for the wafers W in the reaction tube 12 in a conventional pipe and valve connection configuration (configuration where purifying gas is supplied into the raw material supplying pipe 15 from below) and a configuration of the present disclosure. It can be seen from FIG. 49 that the quantity of particles in the present disclosure is substantially the same as conventional. That is, it can be seen that the raw material supplying device 13 of the present disclosure has no adverse effect on properties of the wafers W. In FIG. 49, the present disclosure has the same process conditions as conventional, and, therefore, detailed explanation of which will be omitted.

Figure 50A:
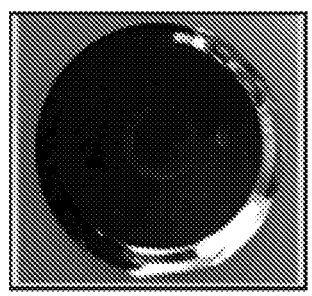
FIGS. 50A to 50G are photographs showing diaphragms of valves in the present disclosure and a conventional example, respectively.
Figure 50B:
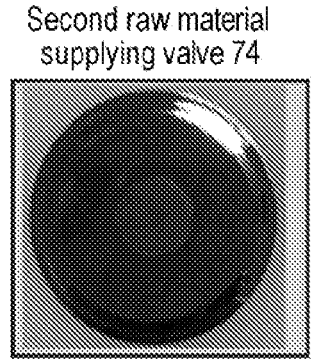
Figure 50C:
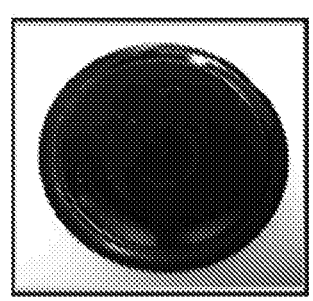
Figure 50D:
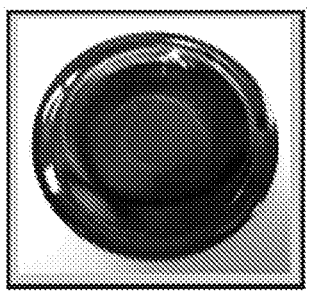
Figure 50E:
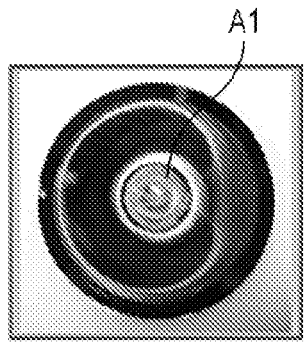
Figure 50F:
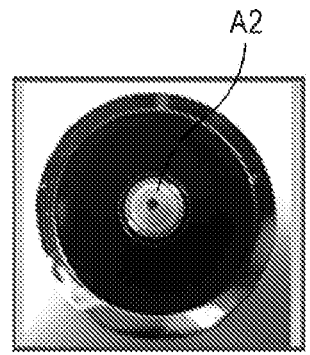
Figure 50G:
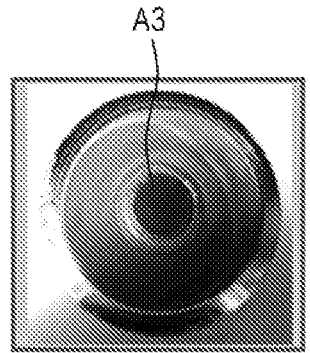

FIGS. 50A to 50G show photographs of diaphragms used in the present disclosure and a conventional example, where valve names are given to photographs of the present disclosure. Specifically, FIGS. 50A to 50D show a cleaning fluid supplying valve 75, a second raw material supply valve 74, a gas supplying valve 77, and a cleaning solution supplying valve 78 of the present disclosure respectively. FIGS. 50E to 50G show valves in a conventional example, wherein FIG. 50E shows a diaphragm of a valve contacting liquid raw material, and FIGS. 50F and 50G show diaphragms of valves distanced from the valve of FIG. 50E to the right side, i.e., from the valve of FIG. 50E to the side of a passage through which the cleaning solution flows. After the valves in the conventional configuration and valves in the configuration of the present disclosure were used for a long time, the conventional configuration showed white attachments A1, A2 and A3 such as Zr—O based compounds on a surface of a valve body (diaphragm) as shown in FIGS. 50E to 50G, whereas the inventive configuration showed little or no attachment on the diaphragm surface as shown in FIGS. 50A to 50D. While white attachments were found in any diaphragms in the conventional example, little or no attachment was found in any diaphragms in the present disclosure.

Herein, although liquid material from the raw material supplying pipe 15 was discharged by purifying gas, the liquid material may be discharged by a cleaning solution. That is, after a film forming process is stopped, the cleaning solution may be supplied into the raw material supplying pipe 15 from above. In this case, after the liquid material is discharged by the cleaning solution, the cleaning solution may be discharged by the purifying gas and then the cleaning solution may be supplied into the raw material supplying pipe 15. In the case of such discharging of the liquid material by the cleaning solution, after the cleaning solution is supplied into the raw material supplying pipe 15, the interior of the raw material supplying pipe 15 may be vacuumized through the internal atmospheres of the vaporizer 11 and the reaction tube 12 in order to volatilize any cleaning solution left in the raw material supplying pipe 15 (without supplying the purifying gas).

Although in the first liquid removal mechanism 50a the bypass passage 54 used the 3-way valve 18b opened below the first raw material discharging valve 73, the bypass passage may use the 3-way valve 18b opened in the lateral side of the valve 73, like the second liquid removal mechanism 50b and the third liquid removal mechanism 50c. In addition, the second liquid removal mechanism 50b and the third liquid removal mechanism 50c may use the 3-way valve 18b having the same structure as the first liquid removal mechanism 50a.

Although the above-described example is illustrated with maintenance of the vaporizer 11 and exchange of the raw material repository 14 with a new one storing different raw material when liquid is removed from the raw material supplying pipe 15, the liquid may be removed from the raw material supplying pipe 15 even when the raw material repository 14 is exchanged with a new one storing the same raw material. In this case, after the removal of the liquid material from the raw material supplying pipe 15 and the cleaning of the raw material supplying pipe 15 are performed as described above, the liquid material in the bypass passage 54 of the first raw material supplying valve 72 is returned to the raw material repository 14 by the purifying gas. Subsequently, after the processes of FIGS. 42 to 47 are performed, the raw material repository 14 is exchanged. Thereafter, the interior of the supplying pipe 14a in the air atmosphere is vacuumized by the vacuum pump 56.

Herein, when liquid is removed from the vaporizer 11 in Step S1, instead of the processes of FIGS. 15 to 24, the second raw material supplying valve 74, the cleaning solution supplying valve 78 and the valve V in the side of the nozzle 31 other than the side of the flow rate regulator 41a in the liquid supplying pipe 41 may be closed, and, at the same time, the gas supplying valve 77, the second raw material discharging valve 76, the first fluid discharging valve 80 and the drainage suction valve 81 may be opened to discharge the liquid raw material by means of the vacuum pump 56 through the second raw material discharging pipe 62, along with the purifying gas. Although in the above-described example the pressure detector 66 is provided in the first raw material discharging pipe 61, the pressure detector 66 may be provided in one of the raw material supplying pipe 15 and the second raw material discharging pipe 62, instead of the first raw material discharging pipe 61, or may be provided in at least one of the raw material discharging pipe 61, the raw material supplying pipe 15 and the second raw material discharging pipe 62.

In addition, although in the above-described example TEMAZ is used as the liquid material, other liquid material such as tetrakis(ethylmethylamino)hafnium (TEMAH), strontium bis(tetramethyl-heptanedionate) $(Sr(THD)_2)$ or the like may be used. Instead of or in addition to octane, hexane or alcohol-based liquid may be used as the cleaning solution.

In addition, two sets of vaporizers 11 and two sets of raw material supplying devices 13 may be provided to alternately supply different liquid materials to the wafers W to form films thereon. Also, although in the above-described example the four liquid removal mechanisms 50 are provided, at least the second liquid removal mechanism 50b may be only provided.

Further, although in the above-described example the removal of liquid from the raw material supplying pipe 15 and the cleaning of the raw material supplying pipe 15 are performed by the control unit 1, an operator may perform such liquid removal and cleaning according to an operating manual. In this case, the operator may progress the above-described steps by pushing valve opening/closing buttons (not shown) corresponding to the valves, which are arranged on an operating screen or an operating panel, based on an operation sequence manual or the like describing a sequence of opening/closing of the valves.

According to some embodiments of the present disclosure, when liquid material is supplied from a repository storing the liquid material into a vaporizer in an upper part through a raw material supplying pipe, a discharging pipe is provided in the side of a lower end of the raw material supplying pipe in the side of the repository and a cleaning fluid supplying pipe for supplying one of purge gas and cleaning solution is connected to the side of an upper end of the raw material supplying pipe. In addition, since the liquid material is discharged from the side of the upper end of the raw material supplying pipe to the discharging pipe by one of the purge gas and the cleaning solution when the liquid material is discharged from the raw material supplying pipe, the liquid material can be extruded from above to below without going against a force of gravity, which can result in easy discharging of the liquid material from the raw material supplying pipe.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A raw material supplying device for vaporizing liquid raw material contained in a repository using a vaporizer, and supplying vaporized gas into a reaction container for semiconductor manufacture, comprising:
   a raw material supplying pipe including a vertically extending rising pipe having an upper end and a lower end to which a vaporizer and a repository are connected respectively;
   a first raw material discharging pipe which is provided to branch from the lower end of the rising pipe;
   a cleaning fluid supplying pipe which is connected to the upper end of the rising pipe and supplies one of purge gas and cleaning solution in order to extrude and discharge liquid raw material in the raw material supplying pipe to the first raw material discharging pipe;
   a first raw material supplying valve and a first raw material discharging valve which are respectively provided in a side of the repository and the first raw material discharging pipe other than a connection portion of the raw material supplying pipe with the first raw material discharging pipe; and
   a cleaning fluid supplying valve which is provided in the cleaning fluid supplying pipe,
   wherein, when the liquid raw material is supplied into the vaporizer, the first raw material supplying valve is opened and the first raw material discharging valve and the cleaning fluid supplying valve are closed, and when the liquid raw material is discharged, the first raw material supplying valve is closed and the first raw material discharging valve and the cleaning fluid supplying valve are opened.

2. The raw material supplying device of claim 1, further comprising a second raw material supplying valve including a 3-way valve which is provided at a joining point of a vertically extending passage and a horizontally extending passage,
   wherein the upper end of the rising pipe of the raw material supplying pipe is connected to the horizontally extending passage of the second raw material supplying valve,
   the cleaning fluid supplying valve is provided above the second raw material supplying valve in the vertically extending passage, and
   the second raw material supplying valve communicates the horizontally extending passage to a downward extending passage when the liquid raw material is supplied into the vaporizer, communicates the horizontally extending passage to an upward extending passage when the liquid raw material is discharged through the rising pipe, and communicates the upward extending passage to the downward extending passage when the liquid raw material is discharged to the side of the vaporizer.

3. The raw material supplying device of claim 2, further comprising a second raw material discharging valve including a 3-way valve which is provided at a joining point of the vertically extending passage and the horizontally extending passage below the second raw material supplying valve in the vertically extending passage,
   wherein the raw material supplying pipe directing to the vaporizer is connected to the horizontally extending passage in the second raw material supplying valve,
   the downward extending passage from the second raw material discharging valve is constituted by a second raw material discharging pipe, and
   the second raw material discharging valve communicates the horizontally extending passage from the second raw material discharging valve to the horizontally extending passage when the liquid raw material is supplied into the vaporizer, and communicates the upward extending passage from the second raw material discharging valve to the downward extending passage when the liquid raw material is discharged.

4. The raw material supplying device of claim 2, further comprising a gas supplying valve including a 3-way valve which is provided at a joining point of the vertically extending passage and the horizontally extending passage for supplying gas used to discharge liquid from a pipe,
   wherein the upward extending passage from the gas supplying valve is connected to the side of an upper end of the cleaning fluid supplying valve,
   the horizontally extending passage from the gas supplying valve is connected to a gas supplying pipe for supplying the gas, and the downward extending passage from the gas supplying valve is connected to a cleaning solution supplying pipe for supplying a cleaning solution used to clean a pipe.

5. The raw material supplying device of claim 4, further comprising a cleaning solution supplying valve including a 3-way valve which is provided at a joining point of the downward extending passage and the horizontally extending passage in the downward extending passage from the gas supplying valve, wherein the horizontally extending passage from the cleaning solution supplying valve is connected to the cleaning solution supplying pipe, and the downward extending passage from the cleaning solution supplying valve is connected to a cleaning solution discharging pipe.

6. The raw material supplying device of claim 1, wherein the first raw material supplying valve includes a 3-way valve which is provided at a joining point of a vertically extending passage and a horizontally extending passage, the first raw material discharging valve is provided below the first raw material supplying valve and the side of an upper end of the first raw material discharging valve is connected to the side of a lower end of the first raw material supplying valve, the repository is connected to the horizontally extending passage of the first raw material supplying valve, and the first raw material discharging pipe is connected to the side of a lower end of the first raw material discharging valve.

7. The raw material supplying device of claim 5, further comprising:

a first fluid discharging valve including a 3-way valve which is provided at a joining point of the vertically extending passage and the horizontally extending passage;

a drainage suction valve which is provided below the first fluid discharging valve and includes a 3-way valve which is provided at a joining point of the vertically extending passage and the horizontally extending passage; and a second fluid discharging valve which is provided below the drainage suction valve, wherein the first raw material discharging pipe is connected to the side of an upper end of the first fluid discharging valve, the second raw material discharging pipe and the cleaning solution discharging pipe are connected to a passage in the lateral side of the first fluid discharging valve, an exhaust mechanism is connected to a passage in the lateral side of the drainage suction valve, a drainage is connected to the side of a lower end of the second fluid discharging valve, when a fluid including at least one of the liquid raw material, the cleaning solution and the purge gas is suctioned by the exhaust mechanism, an upward extending passage of the drainage suction valve is communicated to the horizontally extending passage, the second fluid discharging valve is closed, and a downward extending passage of the first fluid discharging valve is communicated to at least one of the upward extending passage and the horizontally extending passage, and when the fluid is discharged to the drainage, a horizontally extending passage of the drainage suction valve is closed and a vertically extending passage of each of the second fluid discharging valve and the drainage suction valve is communicated to at least one of the downward extending passage, the upward extending passage and the horizontally extending passage of the first fluid discharging valve.

8. The raw material supplying device of claim 7, further comprising a pressure detector which is provided in at least one of the raw material supplying pipe, the first raw material discharging pipe, the second raw material discharging pipe and the cleaning solution discharging pipe for detecting an internal pressure of the at least one pipe.

9. A film forming apparatus comprising:

a raw material supplying device of claim 1;

a vaporizer which vaporizes liquid material supplied from the raw material supplying device; and a reaction container which supplies process gas obtained by vaporizing the liquid material in the vaporizer to substrates accommodated in the reaction container.

\* \* \* \* \*